US 12,402,455 B2

(12) United States Patent
Park et al.

(10) Patent No.: US 12,402,455 B2
(45) Date of Patent: Aug. 26, 2025

(54) DISPLAY DEVICE AND METHOD FOR MANUFACTURING THE SAME

(71) Applicant: Samsung Display Co., Ltd., Yongin-si (KR)

(72) Inventors: Myunghoon Park, Suwon-si (KR); Hyunjoon Kim, Hwaseong-si (KR); Haemin Kim, Gumi-si (KR); Byungchang Yu, Seosan-si (KR); Dong-Hoon Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 518 days.

(21) Appl. No.: 17/880,105

(22) Filed: Aug. 3, 2022

(65) Prior Publication Data
US 2023/0207749 A1    Jun. 29, 2023

(30) Foreign Application Priority Data
Dec. 27, 2021    (KR) ......................... 10-2021-0188277

(51) Int. Cl.
*H01L 33/54*      (2010.01)
*H01L 33/00*      (2010.01)
*H10H 20/01*      (2025.01)
*H10H 20/853*     (2025.01)

(52) U.S. Cl.
CPC .......... *H10H 20/853* (2025.01); *H10H 20/01* (2025.01); *H10H 20/0362* (2025.01)

(58) Field of Classification Search
CPC .... H10H 20/00; H10H 20/01; H10H 20/0362; H10H 20/852; H10H 20/853; H10K 50/844; H10K 50/8426; H10K 50/8428; H10K 59/8722; H10K 59/8723; H10K 59/873

See application file for complete search history.

(56) References Cited

U.S. PATENT DOCUMENTS

| 2014/0117322 | A1  | 5/2014  | Seo et al. |
| 2015/0311473 | A1  | 10/2015 | Kim et al. |
| 2017/0148855 | A1* | 5/2017  | Kaji ................ H10K 50/171 |
| 2017/0357114 | A1  | 12/2017 | Kim et al. |
| 2018/0315802 | A1* | 11/2018 | Kamiyama ....... H10K 59/8722 |

(Continued)

FOREIGN PATENT DOCUMENTS

| KR | 1020150077143 A | 7/2015 |
| KR | 1020150124360 A | 11/2015 |

(Continued)

*Primary Examiner* — David C Spalla
(74) *Attorney, Agent, or Firm* — CANTOR COLBURN LLP

(57) ABSTRACT

A display device includes a first substrate including a display area including pixels and a non-display area adjacent to the display area, a second substrate facing to the first substrate, a sealing member contacting the first substrate and the second substrate and disposed in the non-display area, a light emitting diode disposed on the first substrate in the display area, a protective layer covering the light emitting diode and spaced apart from the sealing member, a spacer disposed in the non-display area, disposed between the protective layer and the sealing member and surrounding the display area, and a filler disposed between the first substrate and the second substrate.

20 Claims, 24 Drawing Sheets

(56) References Cited

U.S. PATENT DOCUMENTS

| | | | |
|---|---|---|---|
| 2019/0081125 A1* | 3/2019 | Murai | H10D 86/443 |
| 2019/0165079 A1* | 5/2019 | Cho | H10K 59/131 |
| 2021/0098737 A1 | 4/2021 | Pang et al. | |

FOREIGN PATENT DOCUMENTS

| | | |
|---|---|---|
| KR | 1020160042323 A | 4/2016 |
| KR | 1020170080306 A | 7/2017 |
| KR | 1020170139195 A | 12/2017 |
| KR | 1020190076945 A | 7/2019 |
| KR | 1020210037352 A | 4/2021 |

\* cited by examiner

DISPLAY DEVICE AND METHOD FOR MANUFACTURING THE SAME

This application claims priority to Korean Patent Application No. 10-2021-0188277, filed on Dec. 27, 2021, and all the benefits accruing therefrom under 35 U.S.C. § 119, the content of which in its entirety is herein incorporated by reference.

BACKGROUND

1. Field

Embodiments relate to a display device. More particularly, embodiments relate to the display device and a method for manufacturing the display device.

2. Description of the Related Art

A display device is a device that displays an image for providing visual information to a user. The display device may include a display panel, and an encapsulation substrate may encapsulate the display panel.

The display panel may include light emitting diodes. A protective layer may be formed on the light emitting diodes to protect the light emitting diodes. The protective layer may be formed using a mask. The display device may include a spacer to support the mask.

SUMMARY

Embodiments provide a display device with improved bonding force between substrates.

Other embodiments provide a method of manufacturing the display device.

A display device according to an embodiment include: a first substrate including a display area including pixels and a non-display area adjacent to the display area, a second substrate facing to the first substrate, a sealing member contacting the first substrate and the second substrate and disposed in the non-display area, a light emitting diode disposed on the first substrate in the display area, a protective layer covering the light emitting diode and spaced apart from the sealing member, a spacer disposed in the non-display area, disposed between the protective layer and the sealing member and surrounding the display area, and a filler disposed between the first substrate and the second substrate.

In an embodiment, the spacer may have a closed loop shape and may surround the display area in a plan view.

In an embodiment, an upper surface of the spacer may be spaced apart from a lower surface of the second substrate, and the filler may overlap the spacer and may be disposed more inward than the sealing member in the plan view.

In an embodiment, an upper surface of the spacer may contact the second substrate, and the filler may be disposed more inward than the spacer in the plan view.

In an embodiment, the spacer may include sub-spacers adjacent to each other in the plan view.

In an embodiment, the sub-spacers may be spaced apart from each other.

In an embodiment, the filler may be disposed more inward than the sealing member in the plan view.

In an embodiment, a first length from an upper surface of the first substrate to an upper surface of the spacer may be greater than a second length from the upper surface of the first substrate to an upper surface of the protective layer in a thickness direction.

A method of manufacturing a display device according to an embodiment forming a spacer in a non-display area adjacent to a display area on a first substrate, forming a light emitting diode in the display area on the first substrate, positioning a mask having an opening on the first substrate to contact an upper surface of the spacer, forming a protective layer covering the light emitting diode and combining the first substrate and a second substrate using a sealing member.

In an embodiment, the light emitting diode may be spaced apart from the spacer.

In an embodiment, the spacer may be formed in a closed loop shape and surrounds the display area.

In an embodiment, the method may further include forming sub-spacers by removing a portion of the spacer.

In an embodiment, the sub-spacers may be spaced apart from each other.

In an embodiment, the protective layer may be formed by chemical vapor deposition.

In an embodiment, the combining the first substrate and the second substrate may include forming the sealing member surrounding the spacer in the non-display area on the first substrate, forming a filler in the display area on the first substrate, positioning the second substrate on the filler and combining the first substrate and the second substrate by contacting the second substrate with the sealing member.

In an embodiment, the filler may fill between the first substrate and the second substrate by pressing the filler by the second substrate.

In an embodiment, the protective layer may be formed more inward than the spacer in a plan view.

In an embodiment, the mask may include a first portion defining the opening and a second portion surrounding the first portion.

In an embodiment, the spacer may contact the first portion of the mask.

In an embodiment, a thickness of the first portion may be greater than a thickness of the second portion.

In a display device according to embodiments of the present disclosure, the protective layer may be disposed more inward than the spacer in a plan view. Accordingly, since the sealing member may directly contact the first substrate, an adhesive force of the sealing member may be effectively improved.

Since the spacer is spaced apart from the display area, damage due to the filler may be prevented. Accordingly, durability of the spacer may be improved.

As the spacer contacts the mask, deposition material may be deposited on the more inward than of the spacer in a plan view. As the sealing member is formed on the first substrate on which the deposition material is not deposited, an adhesive force between the sealing member and the first substrate and an adhesive force between the sealing member SM and the second substrate SUB2 may increase. Accordingly, a bonding force between the first substrate and the second substrate may be increased through the sealing member.

DETAILED DESCRIPTION

Figure 1:
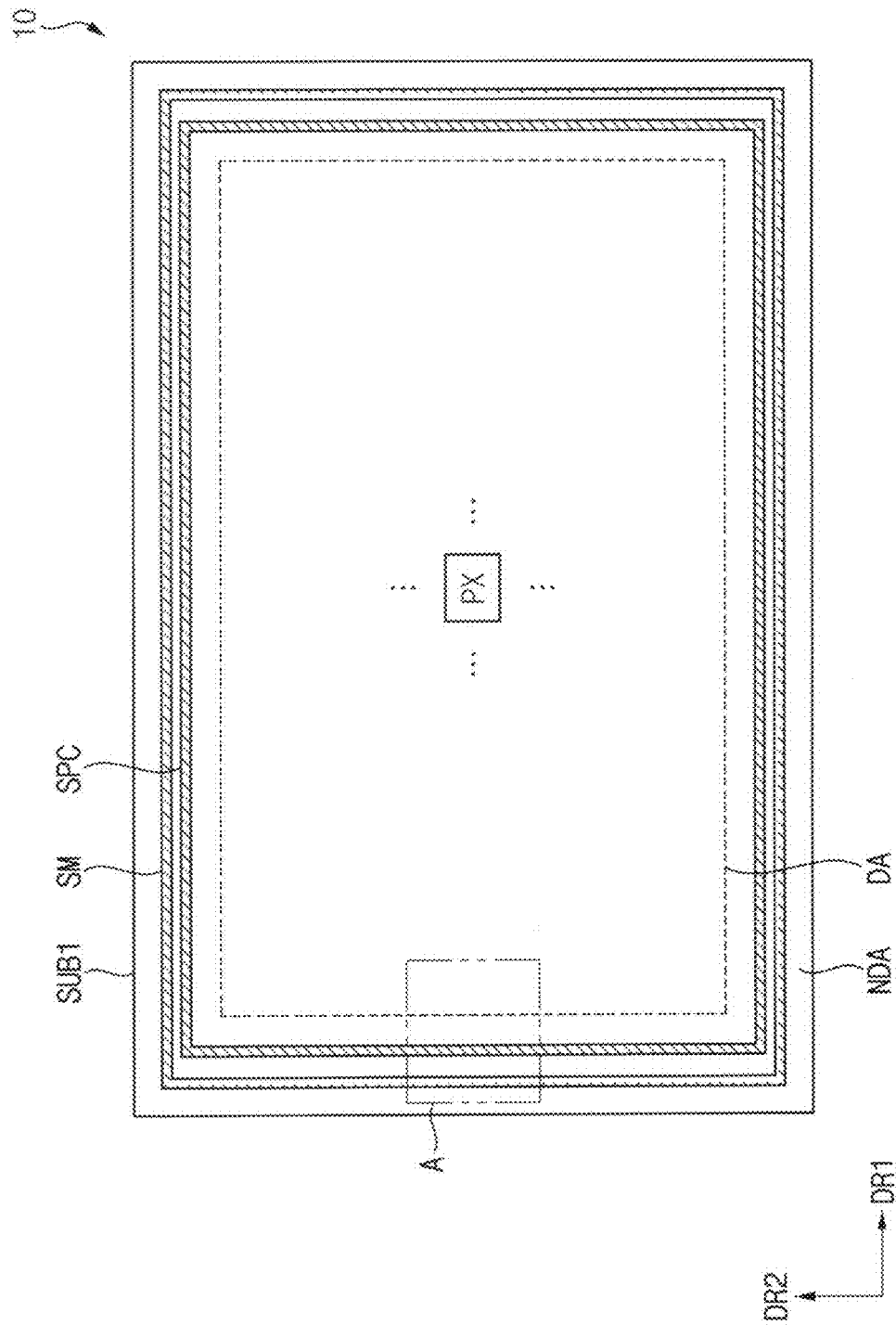
FIG. 1 is a plan view of a display device according to an embodiment.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below. Hereinafter, display devices in accordance with embodiments will be described in more detail with reference to the accompanying drawings. The same reference numerals are used for the same components in the drawings, and redundant descriptions of the same components will be omitted.

Figure 2:
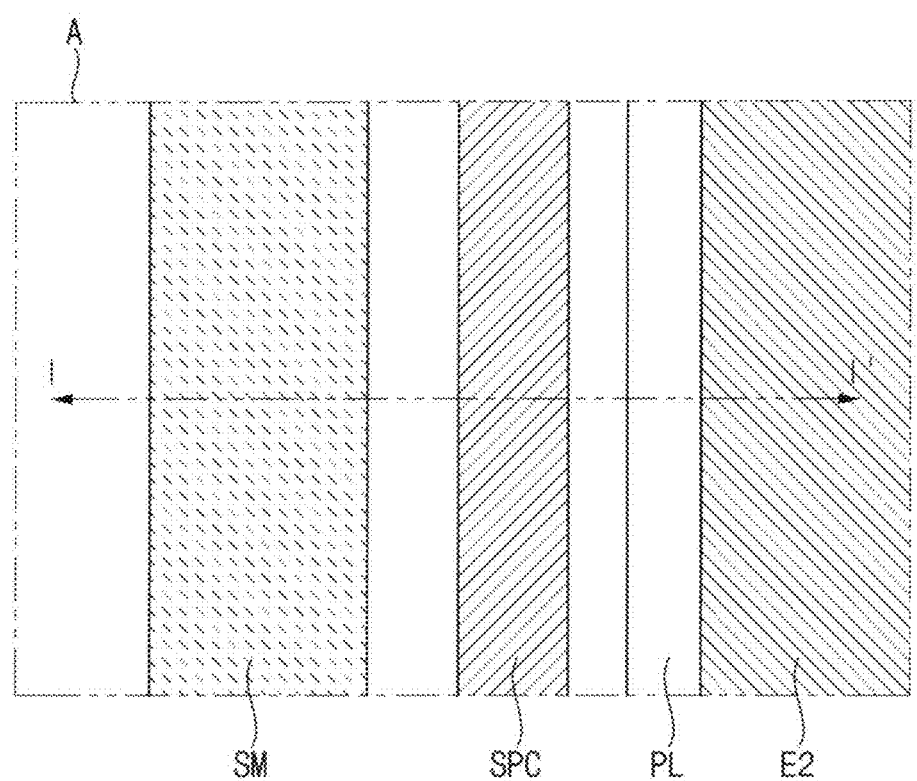
FIG. 2 is an enlarged view of area A of FIG. 1.
Figure 3:
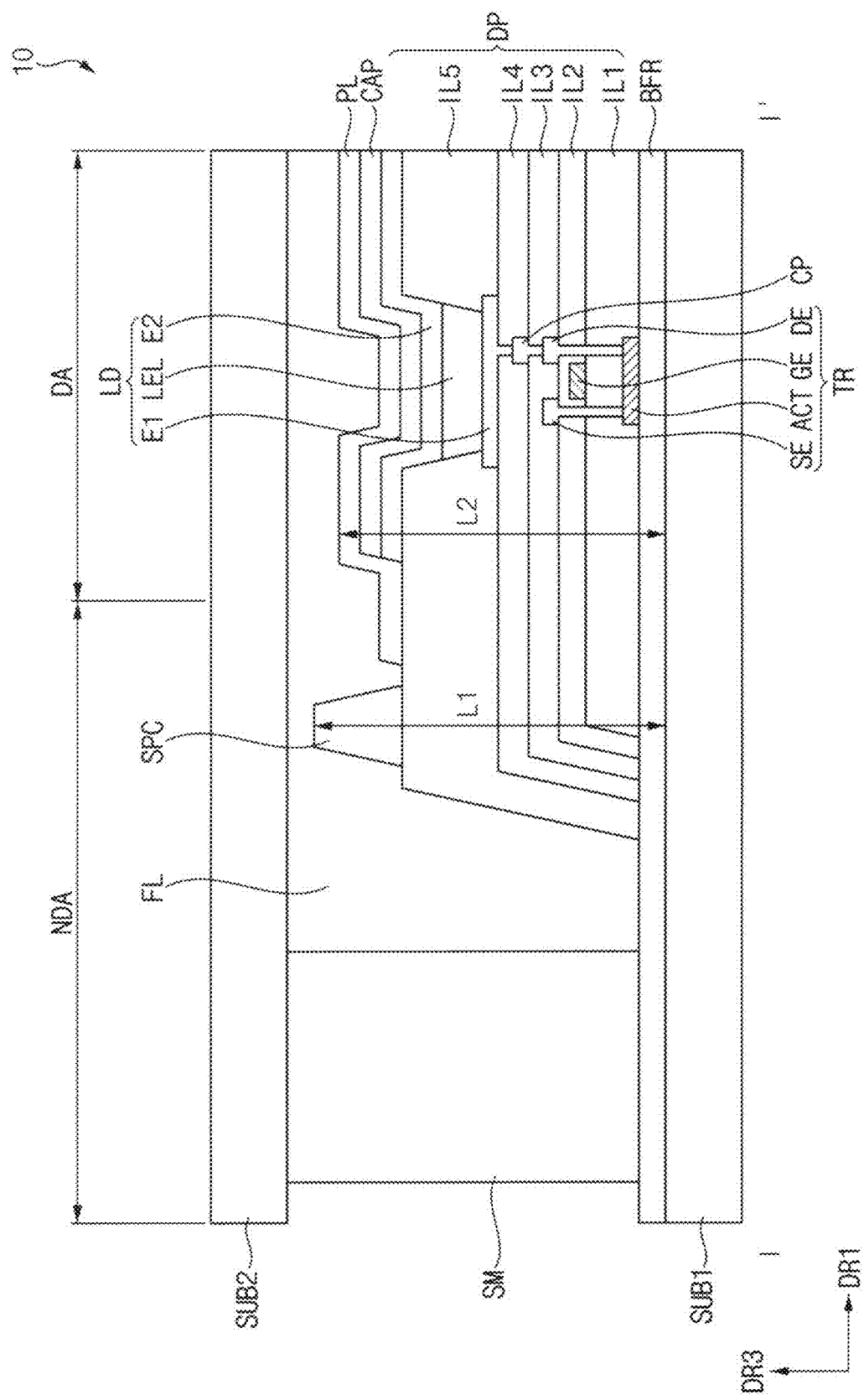
FIG. 3 is a cross-sectional view taken along line I-I' of FIG. 2.

FIG. 1 is a plan view of a display device according to an embodiment. FIG. 2 is an enlarged view of area A of FIG. 1. FIG. 3 is a cross-sectional view taken along line I-I' of FIG. 2. As used herein, the "plan view" is defined as a view in a third direction DR3.

Referring FIG. 1, a display device 10 may include a first substrate SUB1, a buffer layer BFR, a second substrate SUB2, a sealing member SM, a display panel DP, a capping layer CAP, a protective layer PL, a spacer SPC, and a filler FL.

The first substrate SUB1 may include a display area DA and a non-display area NDA. The non-display area NDA may be adjacent to the display area DA. For example, the non-display area NDA may surround the display area DA.

The display area DA may display an image. The display panel DP including pixels PX may be disposed in the display area DA. The pixels PX may include a light emitting diode LD, and the display area DA may be defined as an area in which the light emitting diode LD is disposed. The non-display area NDA may not display an image. A driver transmitting signals and voltages to the display area DA and a controller controlling the driver may be disposed in the non-display area NDA.

However, the present disclosure is not limited thereto, and in another embodiment, for example, pixels may be disposed in the non-display area NDA, and the non-display area NDA may also display an image.

Each of the display area DA and the non-display area NDA may have a rectangular shape. In an embodiment, long sides of the display area DA extend in a first direction DR1 and short sides of the display area DA extend in a second direction DR2. However, the present disclosure is not limited thereto, and in another embodiment, each of the display area DA and the non-display area NDA may have a shape such as a circular shape or a rectangular shape with rounded corners. The third direction DR3 is a thickness direction of the first substrate SUB1, and perpendicular to the first direction DR1 and the second direction DR2.

The display panel DP may be disposed on the first substrate SUB1. The display panel DP may be disposed in the display area DA on the first substrate SUB1. The display panel DP may include an active layer ACT, a first insulation layer IL1, a gate electrode GE, a second insulation layer IL2, a source electrode SE, a drain electrode DE, a third insulation layer IL3, a connection pattern CP, a fourth insulation layer IL4, a light emitting diode LD, and a fifth insulation layer IL5. The light emitting diode LD may include a pixel electrode E1, a light emitting layer LEL, and a common electrode E2.

The buffer layer BFR may be disposed between the first substrate SUB1 and the display panel DP. The buffer layer BFR may prevent diffusion of metal atoms or impurities from the first substrate SUB1 to the active layer ACT.

The active layer ACT may be disposed on the first substrate SUB1. The active layer ACT may be divided into a source region and a drain region, which are doped with impurities, and a channel region between the source region and the drain region.

The first insulation layer IL1 may be disposed on the buffer layer BFR. The first insulation layer IL1 may cover the active layer ACT and may have substantially the same thickness along a profile of the active layer ACT. However, the present disclosure is not limited thereto. In another embodiment, for example, the first insulation layer IL1 may include an inorganic material.

The gate electrode GE may be disposed on the first insulation layer IL1. In an embodiment, the gate electrode GE may overlap the channel region of the active layer ACT in a plan view.

The second insulation layer IL2 may be disposed on the first insulation layer IL1. Also, the second insulation layer IL2 may cover the gate electrode GE and may be disposed to have substantially the same thickness along a profile of the gate electrode GE. However, the present disclosure is not limited thereto.

The source electrode SE and the drain electrode DE may be disposed on the second insulation layer IL2. The source electrode SE may contact the source region of the active layer ACT through a first contact hole formed in the first and second insulation layers IL1 and IL2. The drain electrode DE may contact the drain region of the active layer ACT through a second contact hole formed in the first and second insulation layers IL1 and IL2.

The active layer ACT, the gate electrode GE, the source electrode SE, and the drain electrode DE may constitute a transistor TR. The display device 10 may include at least one transistor TR.

The third insulation layer IL3 may be disposed on the second insulation layer IL2. In addition, the third insulation layer IL3 may cover the source and drain electrodes SE and DE, and may have a substantially flat upper surface without creating a step around the source and drain electrodes SE and DE. For example, the third insulation layer IL3 may include an organic material.

The connection pattern CP may be disposed on the third insulation layer IL3. The connection pattern CP may contact the source electrode SE or the drain electrode DE through a second contact hole formed in the third insulation layer IL3.

The fourth insulation layer IL4 may be disposed on the third insulation layer IL3. Also, the fourth insulation layer IL4 may cover the connection pattern CP, and may have a substantially flat upper surface without creating a step around the connection pattern CP. For example, the fourth insulation layer IL4 may include an organic material.

The light emitting diode LD may be disposed on the fourth insulation layer IL4. The pixel electrode E1 may be disposed on the fourth insulation layer IL4. The pixel electrode E1 may have reflective or transmissive properties. For example, the pixel electrode E1 may include a metal.

The pixel electrode E1 may contact the connection pattern CP through a third contact hole formed in the fourth insulation layer IL4. Through this, the pixel electrode E1 may be connected to the transistor TR.

The fifth insulation layer IL5 may be disposed on the fourth insulation layer IL4. An opening exposing an upper surface of the pixel electrode E1 may be defined in the fifth insulation layer IL5. For example, the fifth insulation layer IL5 may include an organic material or an inorganic material.

The light emitting layer LEL may be disposed on the pixel electrode E1. The light emitting layer LEL may be disposed in the opening formed in the fifth insulation layer IL5. In an embodiment, the light emitting layer LEL may have a multilayer structure including a hole injection layer, a hole transport layer, an organic emission layer, an electron transport layer, and an electron injection layer. The organic light emitting layer may include a light emitting material.

The common electrode E2 may cover the light emitting layer LEL and may be disposed on the fifth insulation layer IL5. In an embodiment, the common electrode E2 may have a plate shape. Also, the common electrode E2 may have transmissive or reflective properties. For example, the common electrode E2 may include a metal.

The capping layer CAP may be disposed on the common electrode E2. The capping layer CAP may protect the common electrode E2.

The protective layer PL may be disposed on the capping layer CAP. The protective layer PL may cover the light emitting diode LD and may protect the light emitting diode LD. The protective layer PL may prevent moisture and oxygen from penetrating into the light emitting diode LD from outside or the filler FL. The protective layer PL may include an inorganic material.

The spacer SPC may be disposed on the fifth insulation layer IL5. The spacer SPC may be disposed between the protective layer PL and the sealing member SM in a plan view. The spacer SPC may surround the display area DA. The spacer SPC may be spaced apart from the light emitting diode LD. The spacer SPC may include the same material as the fifth insulation layer IL5. The spacer SPC may have a continuous band shape.

A length L1 from an upper surfaces of the first substrate SUB1 to an upper surface of the spacer SPC may be greater than a length L2 from the upper surface of the first substrate SUB1 to an upper surface of the protective layer PL. That is, the upper surface of the spacer SPC may be positioned above the upper surface (i.e., the uppermost surface) of the protective layer PL. The length L1 and the length L2 is measured in the third direction DR3.

The second substrate SUB2 may face the first substrate SUB1. The second substrate SUB2 may be an encapsulation substrate that encapsulates the display panel DP. The second substrate SUB2 may be divided into the display area DA and the non-display area NDA.

The first substrate SUB1 and the second substrate SUB2 may be formed of a rigid material such as glass. Also, in another embodiment, the first substrate SUB1 and the second substrate SUB2 may be formed of a flexible material such as polyimide.

The sealing member SM may combine the first substrate SUB1 and the second substrate SUB2 to each other. Glass frit may be used as the sealing member SM.

The sealing member SM may contact the first substrate SUB1 and the second substrate SUB2. In an embodiment, the sealing member SM may directly contact the first substrate SUB1 or contact the first substrate SUB1 through the buffer layer BFR, and the sealing member SM may directly contact the second substrate SUB2. The sealing member SM may be disposed on the first substrate SUB1. The sealing member SM may be disposed in the non-display area NDA on the first substrate SUB1.

The sealing member SM may be spaced apart from the display panel DP. The sealing member SM may surround the display panel DP. Also, the sealing member SM may be spaced apart from the protective layer PL.

The filler FL may be disposed between the first substrate SUB1 and the second substrate SUB2. The filler FL may fill a space between the first substrate SUB1 and the second substrate SUB2. The filler FL may be disposed on the display panel DP. The filler FL may cover the display panel DP. The filler FL may protect the display panel DP. In addition, the filler FL may combine the first substrate SUB1 and the second substrate SUB2 to each other.

In an embodiment, the spacer SPC may be spaced apart from the display area DA by about 1500 micrometers to about 1900 micrometers in the first direction DR1 or the second direction DR2. When the spacer SPC is spaced apart from the display area DA by about 1500 micrometers or less, the spacer SPC may be damaged by being pressed by the filler FL. When the spacer SPC is spaced apart from the display area DA by about 1900 micrometers or more, the area of the non-display area NDA may increase. Accordingly, an area ratio of the display area DA may be relatively reduced.

In an embodiment, the upper surface of the spacer SPC may be spaced apart from the lower surface of the second substrate SUB2. Accordingly, the spacer SPC and the second substrate SUB2 may not contact each other. In this case, the filler FL may overlap the spacer SPC in a plan view. That is, the filler FL may cover the display panel DP and the spacer SPC.

The filler FL may be disposed more inward than the sealing member SM in a plan view. That is, the filler FL may cover the display panel DP, the filler FL may overlap the spacer SPC, and the filler FL may be disposed between the spacer SPC and the sealing member SM in a plan view. The filler FL may fill a space defined by the display panel DP, the second substrate SUB2, and the sealing member SM.

Figure 4:
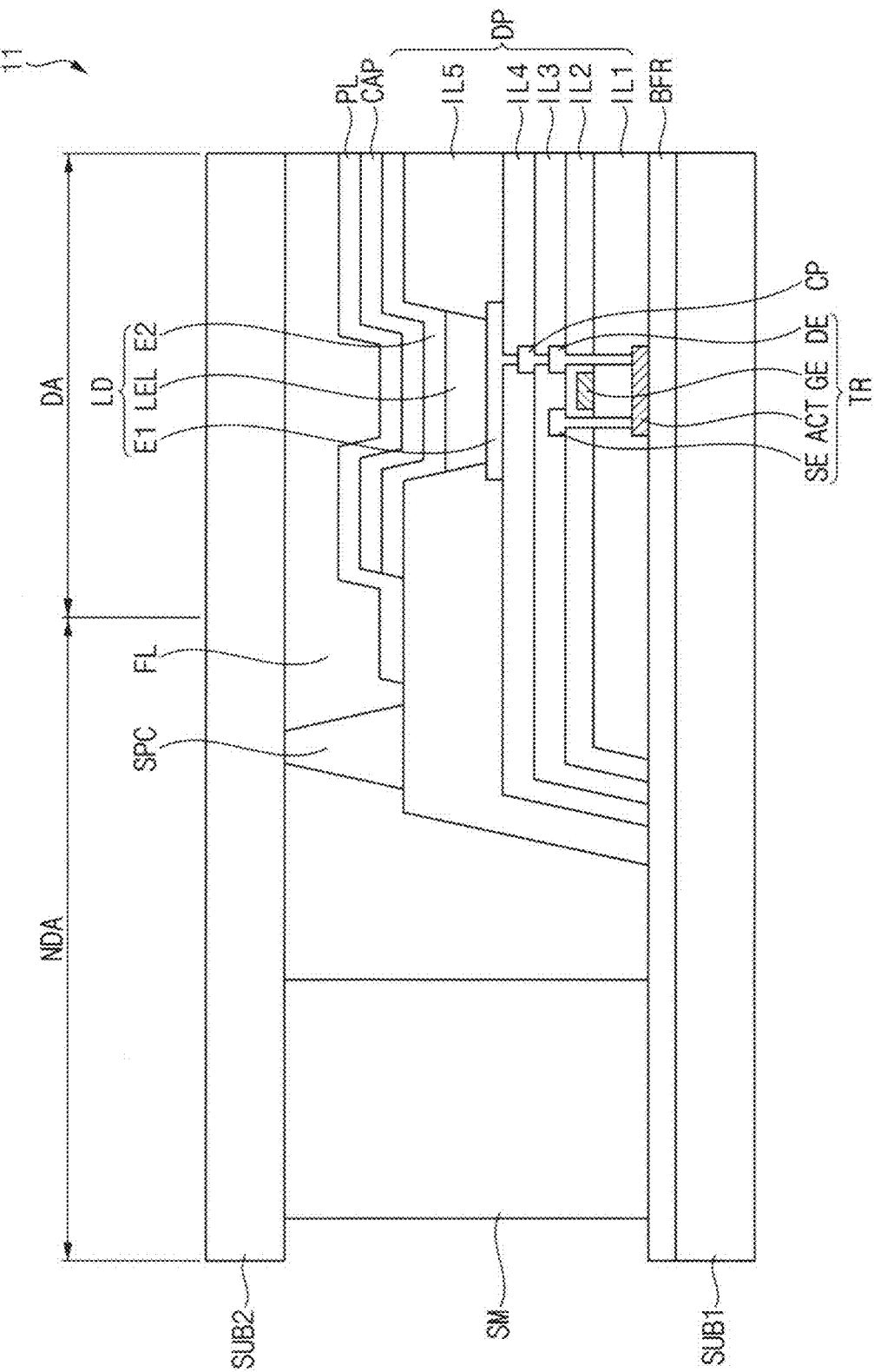
FIG. 4 is a cross-sectional view according to another embodiment.

FIG. 4 is a cross-sectional view according to another embodiment.

In a display device 11 described with reference to FIG. 4, a description overlapping with the display device 10 described with reference to FIG. 3 may be omitted.

Referring to FIGS. 1, 2 and 4, the display device 11 may include a first substrate SUB1, a buffer layer BFR, a second substrate SUB2, a sealing member SM, a display panel DP, and a capping layer CAP, a protective layer PL, a spacer SPC, and a filler FL.

The spacer SPC may be disposed on the fifth insulation layer IL5. The spacer SPC may be disposed between the protective layer PL and the sealing member SM in a plan view. The spacer SPC may surround the display area DA. The spacer SPC may be spaced apart from the light emitting diode LD. The spacer SPC may have a continuous band shape.

In an embodiment, an upper surface of the spacer SPC may directly contact the second substrate SUB2. In this case, the filler FL may be disposed more inward than the spacer SPC in a plan view. That is, the filler FL may be disposed closer to a center of the display area DA than the spacer SPC in a plan view. The filler FL may cover the display panel DP. The filler FL may fill an inner space of the spacer SPC. The filler FL may not be disposed between the spacer SPC and the sealing member SM in a plan view. The filler FL may fill a space defined by the display panel DP, the second substrate SUB2, and the spacer SPC.

In an embodiment, the protective layer PL may be disposed more inward than the spacer SPC in a plan view. That is, the protective layer PL may be disposed closer to the center of the display panel DP than the spacer SPC in a plan view. Accordingly, since the sealing member SM directly contacts the first substrate SUB1, an adhesive force of the sealing member SM may be improved.

In addition, since the protective layer PL covers the light emitting diode LD, the protective layer PL may protect the light emitting diode LD from moisture permeation by the filler FL.

As the spacer SPC is spaced apart from the display area DA, damage by the filler FL may be prevented. Accordingly, durability of the spacer SPC may be improved.

Figure 5:
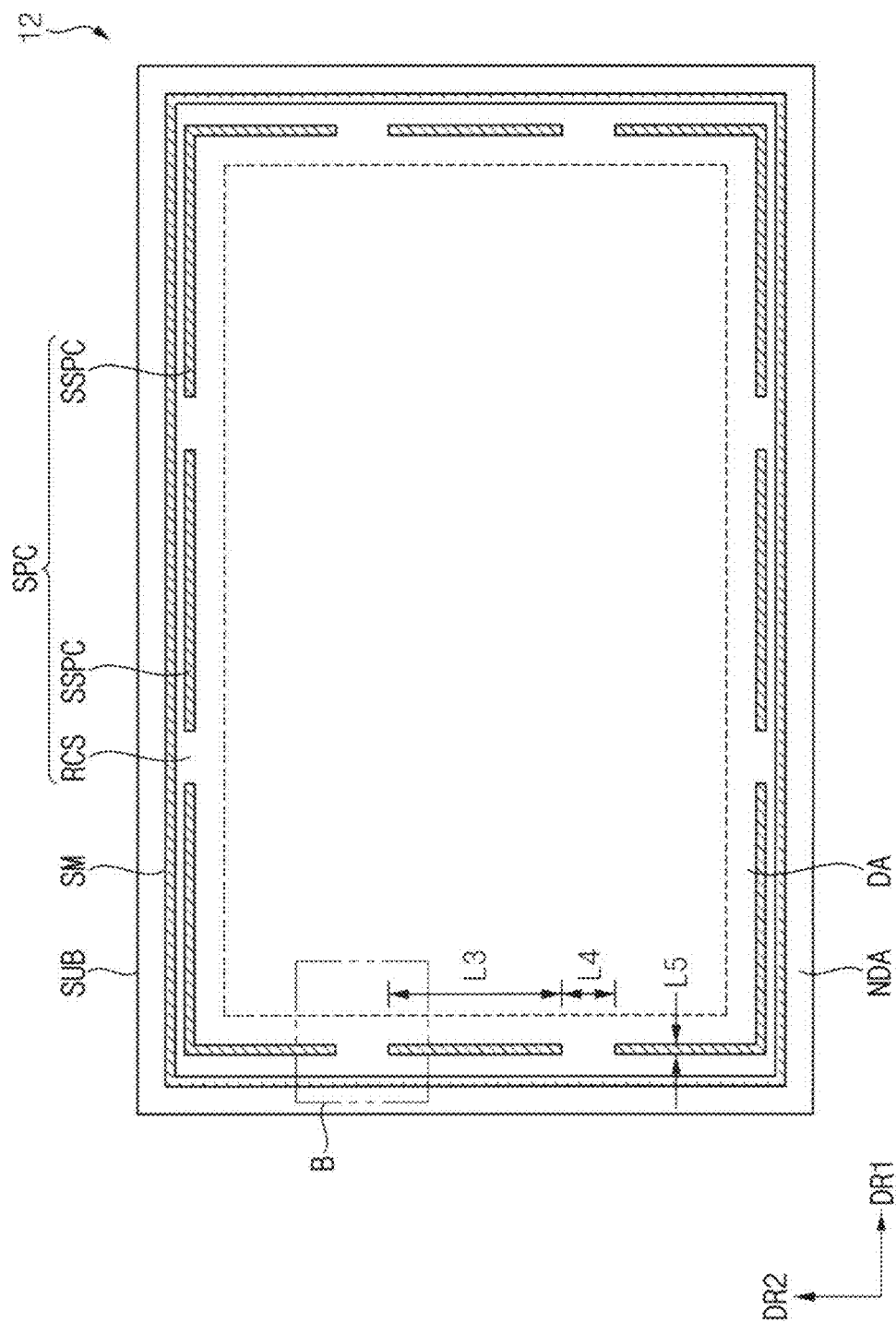
FIG. 5 is a plan view a display device according to another embodiment.
Figure 6:
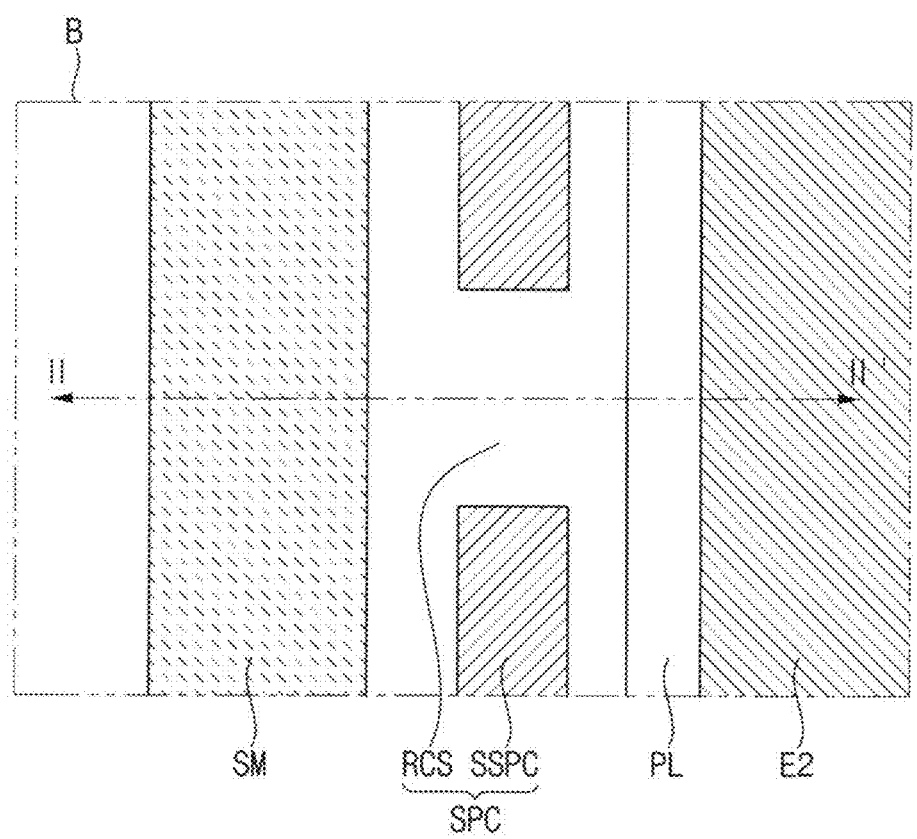
FIG. 6 is an enlarged view of area B of FIG. 5.
Figure 7:
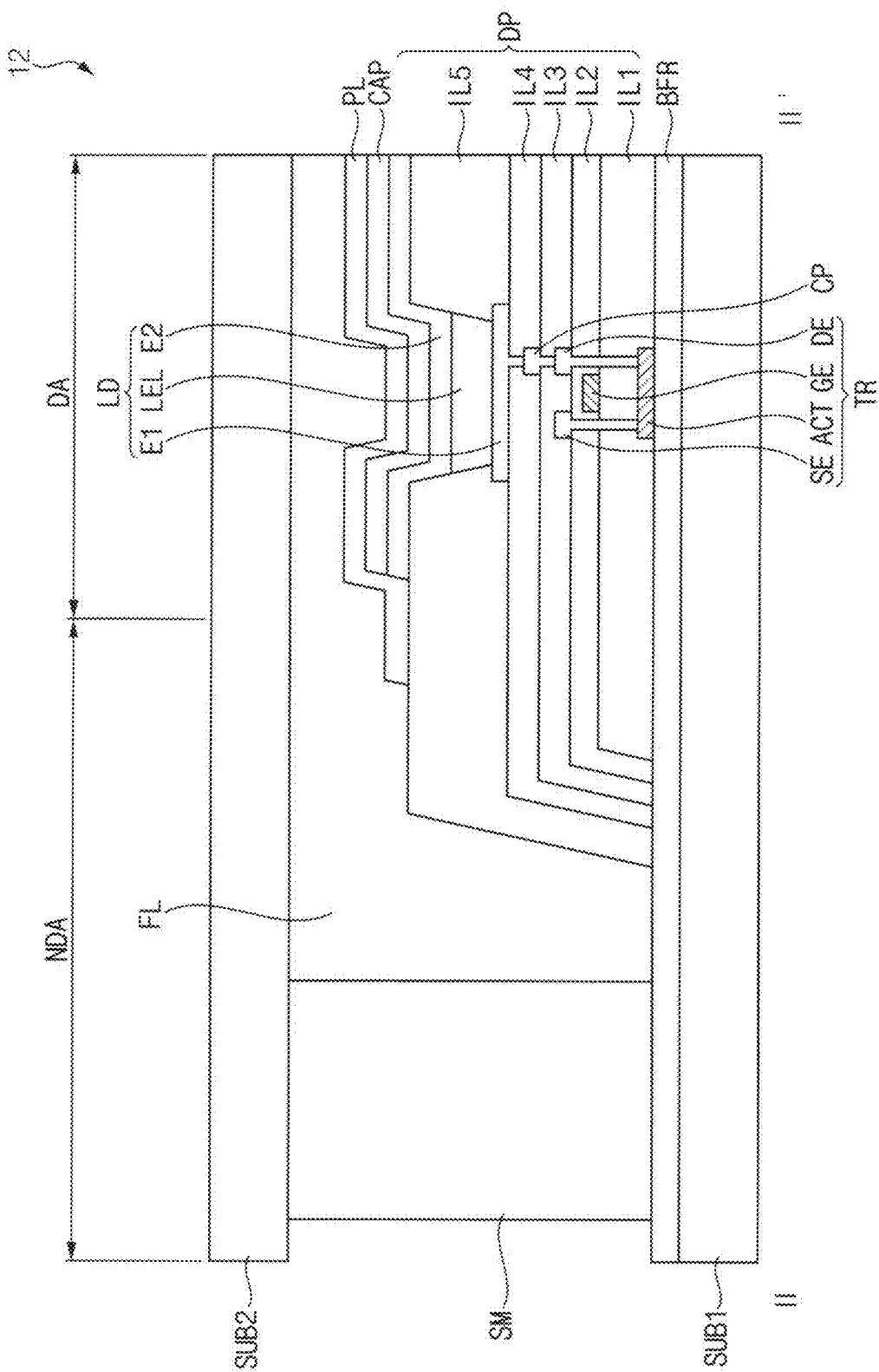
FIG. 7 is a cross-sectional view taken along line II-IF of FIG. 6.

FIG. 5 is a plan view illustrating a display device according to another embodiment. FIG. 6 is an enlarged view of area B of FIG. 5. FIG. 7 is a cross-sectional view taken along line II-IF of FIG. 6.

In a display device 12 described with reference to FIGS. 5 to 7, a description overlapping the display device 10 described with reference to FIGS. 1 to 3 may be omitted.

Referring to FIGS. 5 to 7, the display device 12 may include a first substrate SUB1, a buffer layer BFR, a second substrate SUB2, a sealing member SM, a display panel DP, and a capping layer CAP, a protective layer PL, a spacer SPC, and a filler FL.

The spacer SPC may be disposed on the fifth insulation layer IL5. The spacer SPC may be disposed between the protective layer PL and the sealing member SM. The spacer SPC may surround the display area DA. The spacer SPC may be spaced apart from the light emitting diode LD. The spacer SPC may include the same material as the fifth insulation layer IL5.

The spacer SPC may include sub-spacers SSPC. That is, the sub-spacers SSPC may have a partially removed band shape. The sub-spacers SSPC may be adjacent to each other. The sub-spacers SSPC may be adjacent to each other in a longitudinal direction (i.e., the direction in which the sub-spacers SSPC extend such as the first direction DR1 or the second direction DR2) of the spacer SPC.

The sub-spacers SSPC may be spaced apart from each other. Portions between the adjacent sub-spacers SSPC may be defined as recesses RCS.

The sub-spacers SSPC may be disposed on the fifth insulation layer IL5, and the recesses RCS may expose the fifth insulation layer IL5.

A length L3 of each of the sub-spacers SSPC in the longitudinal direction (e.g., the second direction DR2) may be greater than a length L4 of each of the recesses RCS in the longitudinal direction. Also, the length L3 of each of the sub-spacers SSPC in the longitudinal direction may be greater than a width L5 of each of the sub-spacers SSPC measured in a latitudinal direction (e.g., the first direction DR1) of the spacer SPC.

In an embodiment, the filler FL may flow out into a space between the sealing member SM and the spacer SPC through the recesses RCS. Accordingly, in a plan view, the filler FL may be disposed more inward than the sealing member SM. That is, the filler FL may be disposed closer to the center of the display area DA than the sealing member SM. Accordingly, the filler FL may fill a space defined by the display panel DP, the second substrate SUB2, and the sealing member SM.

Figure 8:
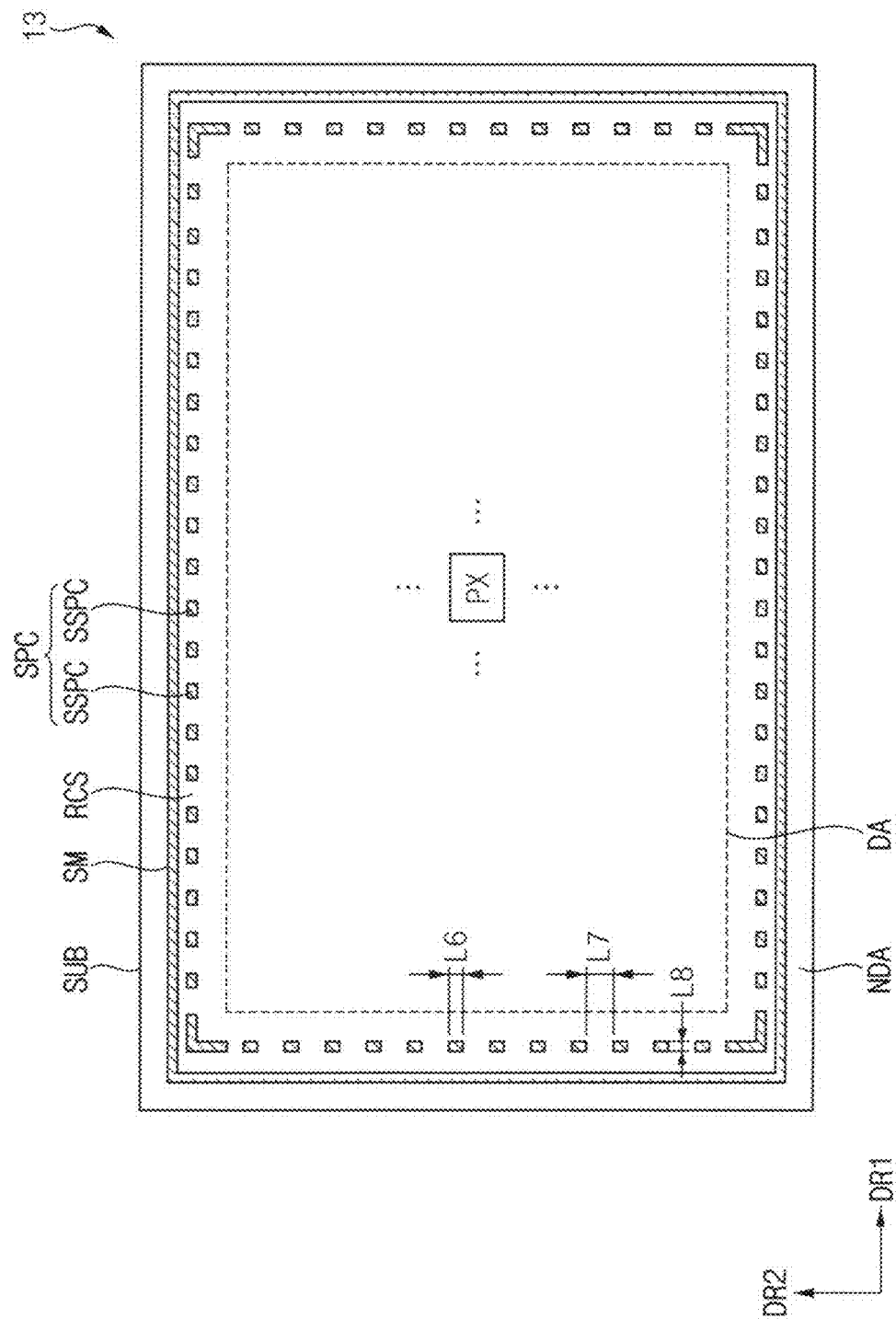
FIG. 8 is a plan view illustrating a display device according to still another embodiment.

FIG. 8 is a plan view illustrating a display device according to still another embodiment.

In a display device 13 described with reference to FIG. 8, a description overlapping the display device 10 described with reference to FIGS. 1 to 3 or the display device 12 described with reference to FIGS. 5 to 7 may be omitted.

Referring to FIG. 8, a spacer SPC included in the display device 12 may be disposed on the fifth insulation layer IL5. The spacer SPC may be disposed between the protective layer PL and the sealing member SM in a plan view. The spacer SPC may surround the display area DA.

The spacer SPC may include sub-spacers SSPC. That is, the sub-spacers SPC may have a partially removed band shape. The sub-spacers SSPC may be adjacent to each other. The sub-spacers SSPC may be adjacent to each other in the longitudinal direction of the spacer SPC.

The sub-spacers SSPC may be spaced apart from each other. Portions between the adjacent sub-spacers SSPC may be defined as the recesses RCS.

A length L6 of each of the sub-spacers SSPC in the longitudinal direction (e.g., the second direction DR2) may be less than or substantially equal to a length L7 of each of the recesses RCS in the longitudinal direction. In addition, the length L6 of each of the sub-spacers SSPC in the longitudinal direction may be substantially the same as the width L8 of each of the sub-spacers SSPC measured in a latitudinal direction (e.g., the first direction DR1) of the spacer SPC.

That is, the length L6 of each of the sub-spacers SSPC of FIG. 8 may be smaller than the length L3 of each of the sub-spacers SSPC of FIG. 5. Also, the number of sub-spacers SSPC of FIG. 8 may be greater than the number of sub-spacers SSPC of FIG. 5.

In an embodiment, the filler FL may fill the space defined by the display panel DP, the second substrate SUB2, and the sealing member SM through the recesses RCS included in the spacer SPC. Accordingly, the filler FL may entirely fill the inside of the sealing member SM in a plan view.

Also, gases generated by outgassing in the display area DA may be discharged through the recesses RCS included in the spacer SPC.

FIGS. 9 to 21 are views for explaining a method of manufacturing a display device according to an embodiment.

FIGS. 9 to 21 may illustrate a method of manufacturing the display device 10 of FIGS. 1 to 3. Accordingly, in the method of manufacturing the display device described with reference to FIGS. 9 to 21, a description overlapping with the display device 10 described with reference to FIGS. 1 to 3 may be omitted.

Figure 10:
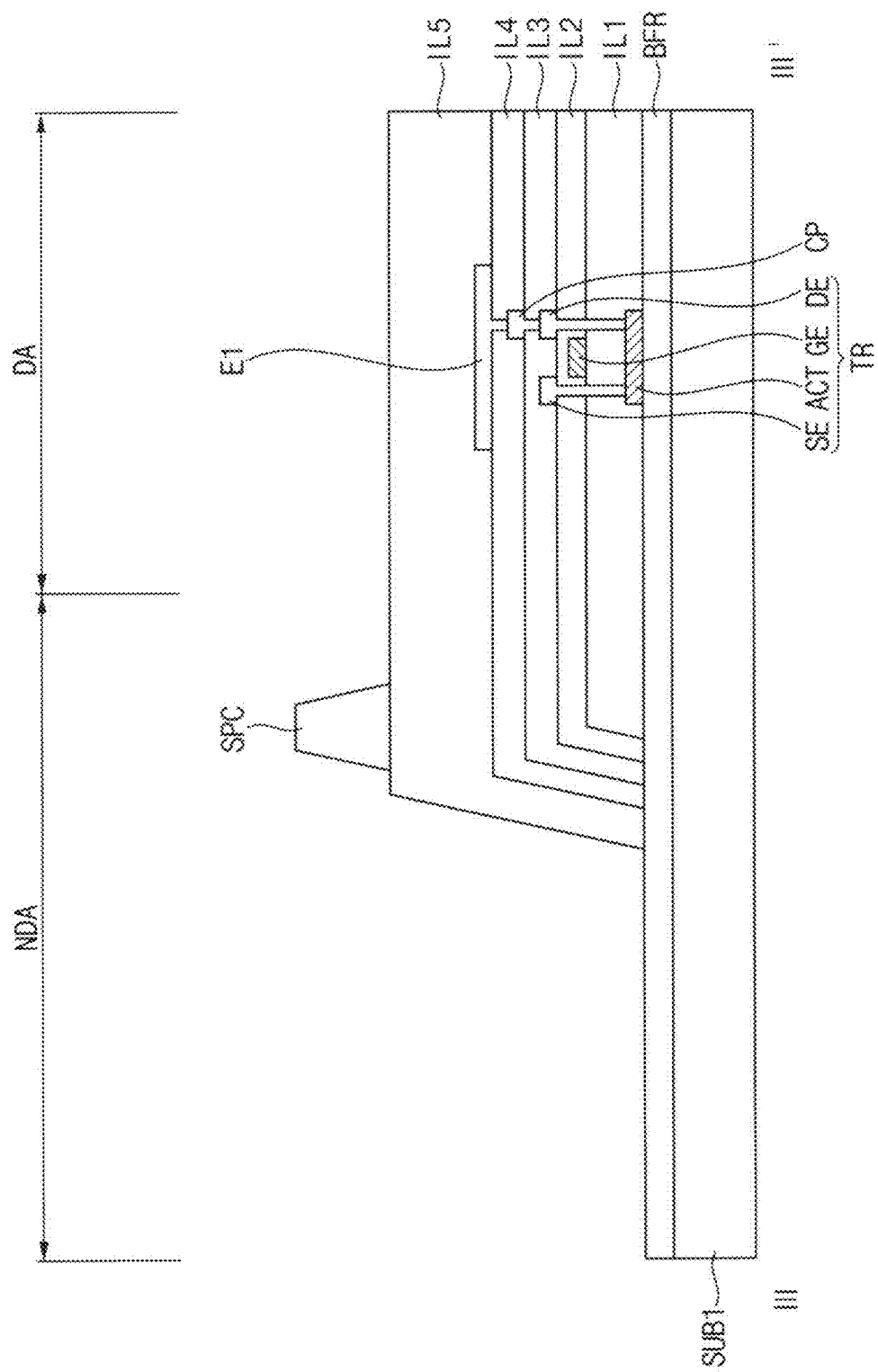

FIG. 10 is a cross-sectional view taken along line of FIG.

Figure 9:
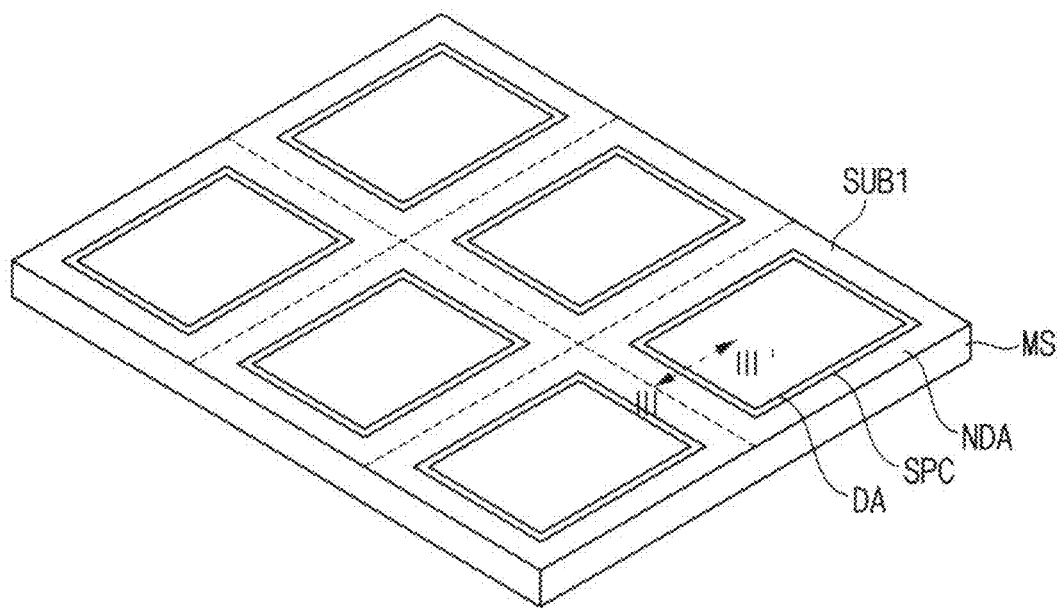
FIGS. 9 to 21 are views for explaining a method of manufacturing a display device according to an embodiment.

Referring to FIGS. 9 and 10, a mother substrate MS may be prepared. At least one display panel DP may be disposed on the mother substrate MS. The mother substrate MS may be cut, and at least one first substrate SUB1 may be formed by the mother substrate MS being cut. Accordingly, at least one display device (e.g., the display device 10 of FIG. 1) may be manufactured from the mother substrate MS.

For example, the mother substrate MS may include six first substrates SUB1. The display panel DP may be disposed on each of the first substrates SUB1. However, in embodiments according to the present disclosure, the number of first substrates SUB1 included in the mother substrate MS is not limited thereto.

A buffer layer BFR, a transistor TR, a plurality of insulation layers, a connection pattern CP, and a pixel electrode E1 may be formed on at least one of the first substrates SUB1 included in the mother substrate MS.

The buffer layer BFR may be formed in the display area DA and the non-display area NDA on the first substrate SUB1.

In the display area DA, the transistor TR may be formed on the buffer layer BFR. The transistor TR may include an active layer ACT, a gate electrode GE, a source electrode SE, and a drain electrode DE. The active layer ACT may be disposed on the buffer layer BFR. The first insulation layer IL1 may be formed on the buffer layer BFR to cover the active layer ACT. A gate electrode GE may be formed on the first insulation layer IL1. The second insulation layer IL2 may be formed on the first insulation layer IL1 to cover the gate electrode GE.

A source electrode SE and a drain electrode DE may be formed on the second insulation layer IL2. A first contact hole may be formed in the first insulation layer IL1 and the second insulation layer IL2. Each of the source electrode SE and the drain electrode DE may contact the active layer ACT through the first contact hole. The active layer ACT, the gate electrode GE, the source electrode SE, and the drain electrode DE may form a transistor TR.

A third insulation layer IL3 may be formed on the second insulation layer IL2 to cover the source electrode SE and the drain electrode DE. The third insulation layer IL3 may have a substantially flat upper surface.

In the display area DA, a connection pattern CP may be formed on the third insulation layer IL3. A second contact hole may be formed in the third insulation layer IL3. The connection pattern CP may contact the source electrode SE or the drain electrode DE through the second contact hole. Accordingly, the connection pattern CP may be connected to the transistor TR.

A fourth insulation layer IL4 may be formed on the third insulation layer IL3 to cover the connection pattern CP. The fourth insulation layer IL4 may have a substantially flat upper surface.

In the display area DA, a pixel electrode E1 may be formed on the fourth insulation layer IL4. A third contact hole may be formed in the fourth insulation layer IL4. The pixel electrode E1 may contact the connection pattern CP through the third contact hole. Accordingly, the pixel electrode E1 may be connected to the connection pattern CP, and the pixel electrode E1 may be connected to the transistor TR. A fifth insulation layer IL5 may be formed on the fourth insulation layer IL4 to cover the pixel electrode E1.

In an embodiment, a spacer SPC may be formed on the fifth insulation layer IL5 in the non-display area NDA. The fifth insulation layer IL5 and the spacer SPC may have the same material. The spacer SPC may be formed simultaneously with the fifth insulation layer IL5.

The spacer SPC may be formed in a continuous band shape. The spacer SPC may surround the display area DA.

Figure 11:
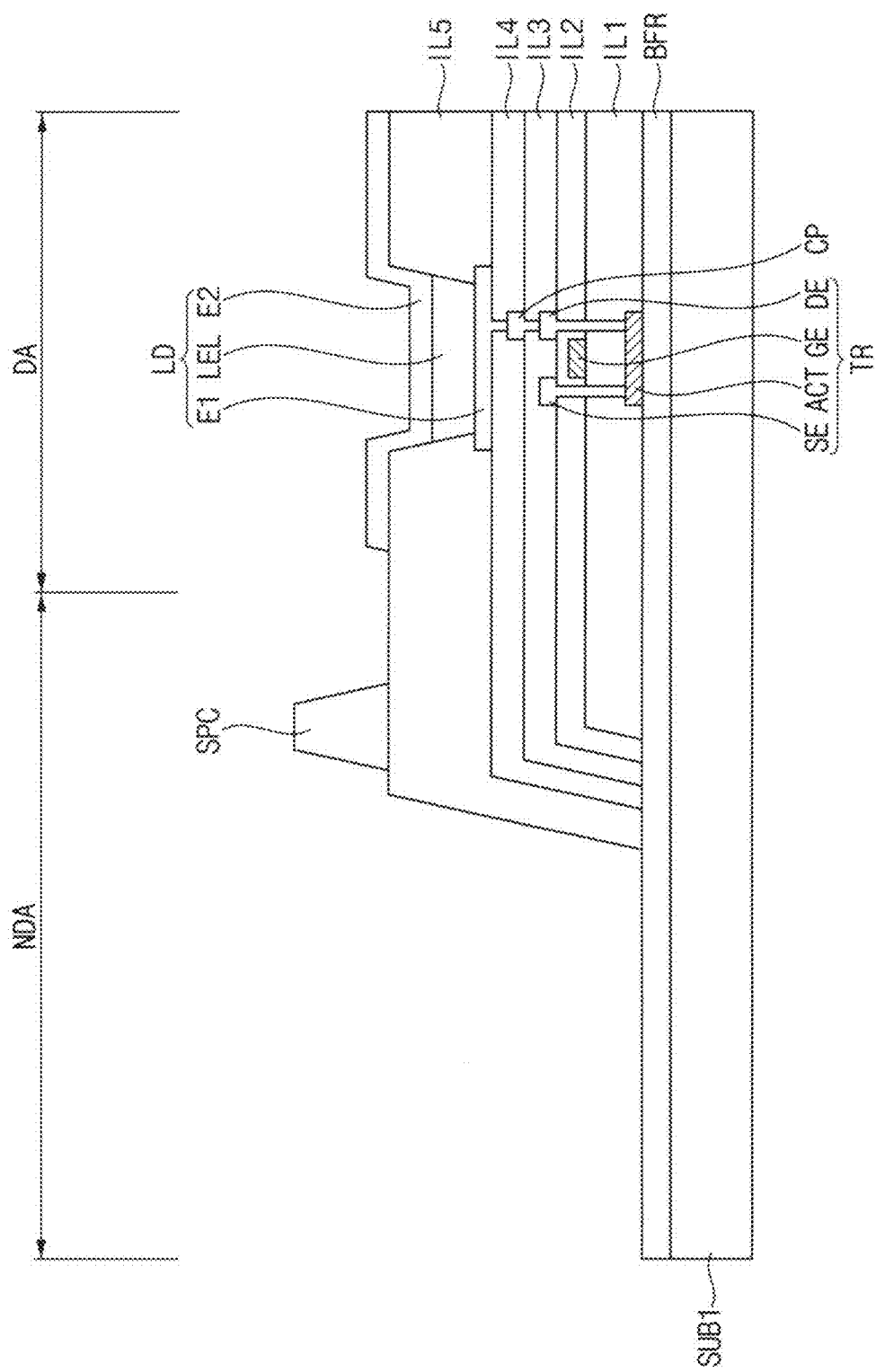

Referring to FIG. 11, an opening passing through the fifth insulation layer IL5 may be formed in the display area DA. The opening may expose an upper surface of the pixel electrode E1. An light emitting layer LEL may be formed on the pixel electrode E1. The light emitting layer LEL may have a structure in which a hole injection layer, a hole transport layer, an organic emission layer, an electron transport layer, and an electron injection layer are sequentially formed.

In the display area DA, the light emitting layer LEL may be formed in the opening. However, embodiments according to the present disclosure are not limited thereto, and the light emitting layer LEL may extend along the upper surface of the fifth insulation layer IL5 in another embodiment.

In the display area DA, the common electrode E2 may be formed on the fifth insulation layer IL5 to cover the light emitting layer LEL. The common electrode E2 may have a plate shape. The common electrode E2 may cover the display area DA. However, the common electrode E2 may be spaced apart from the spacer SPC.

The pixel electrode E1, the light emitting layer LEL, and the common electrode E2 may form a light emitting diode LD. The light emitting diode LD may be spaced apart from the spacer SPC.

Figure 12:
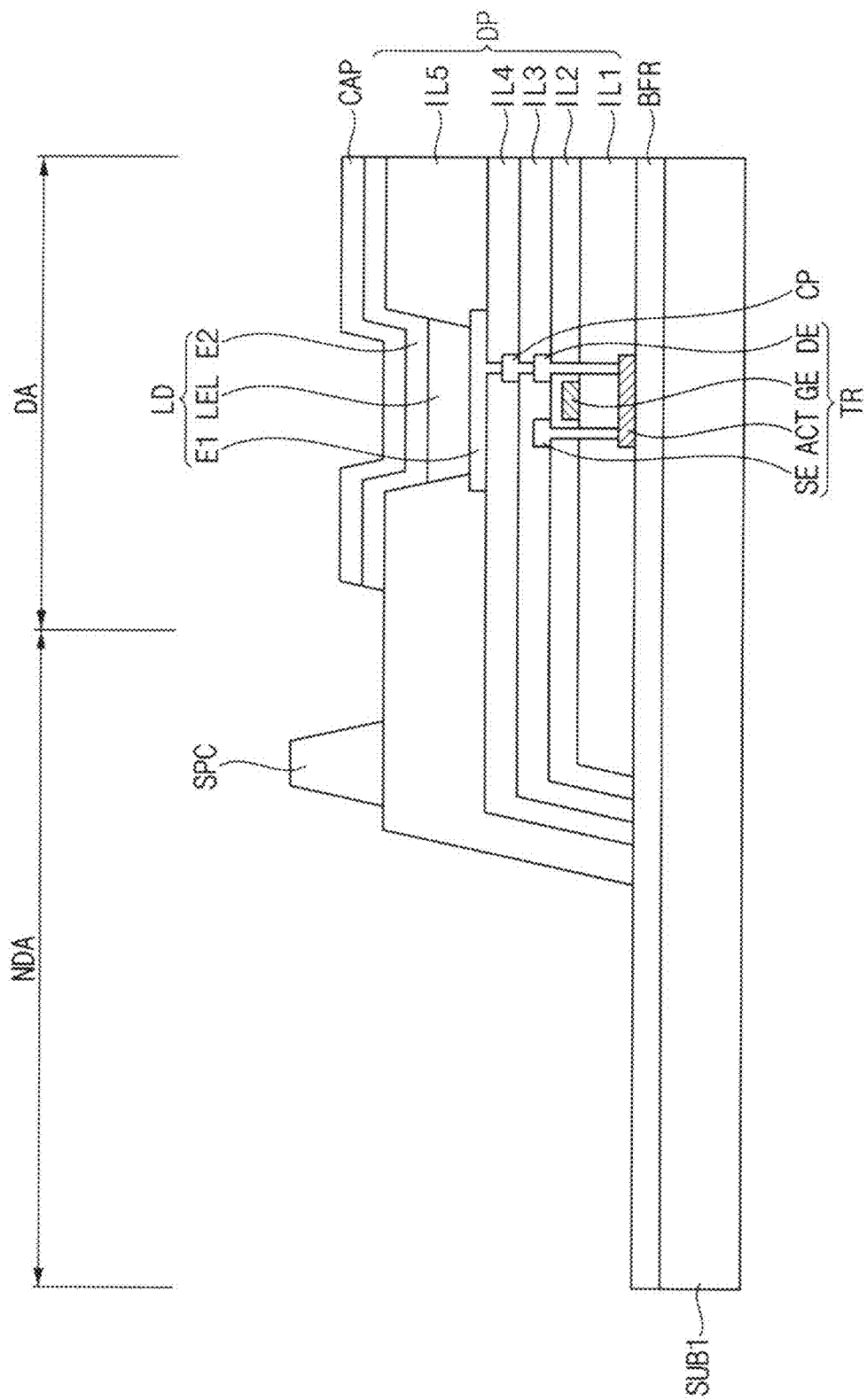

Referring to FIG. 12, in the display area DA, a capping layer CAP may be formed on the common electrode E2. The capping layer CAP may cover the common electrode E2 and may protect the common electrode E2.

Figure 13:
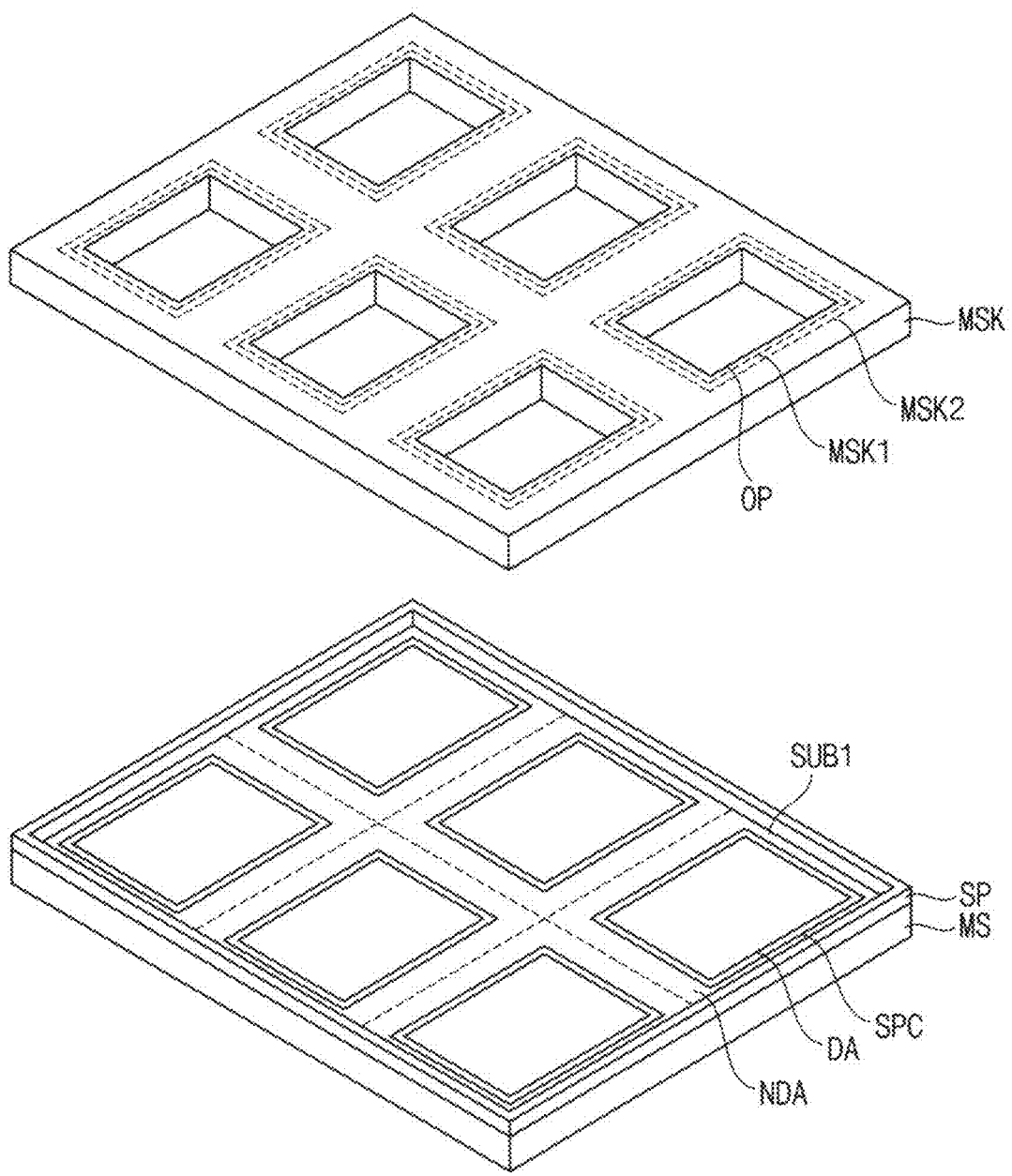

Referring to FIG. 13, a mask MSK may be disposed on the mother substrate MS including the first substrates SUB1.

A plurality of openings OP may be defined in the mask MSK. In a plan view, the openings OP may overlap the first substrates SUB1 included in the mother substrate MS, respectively.

The mask MSK may include first portions MSK1 and second portions MSK2. Each of the first portions MSK1 may define the openings OP. That is, each of the first portions MSK1 may surround each of the openings OP. Each of the second portions MSK2 may surround each of the first portions MSK1. The first portions MSK1 may be spaced apart from each other. The second portions MSK2 may be spaced apart from each other. However, embodiments according to the present disclosure are not limited thereto, and the second portions MSK2 may be connected to each other in another embodiment.

Figure 14:
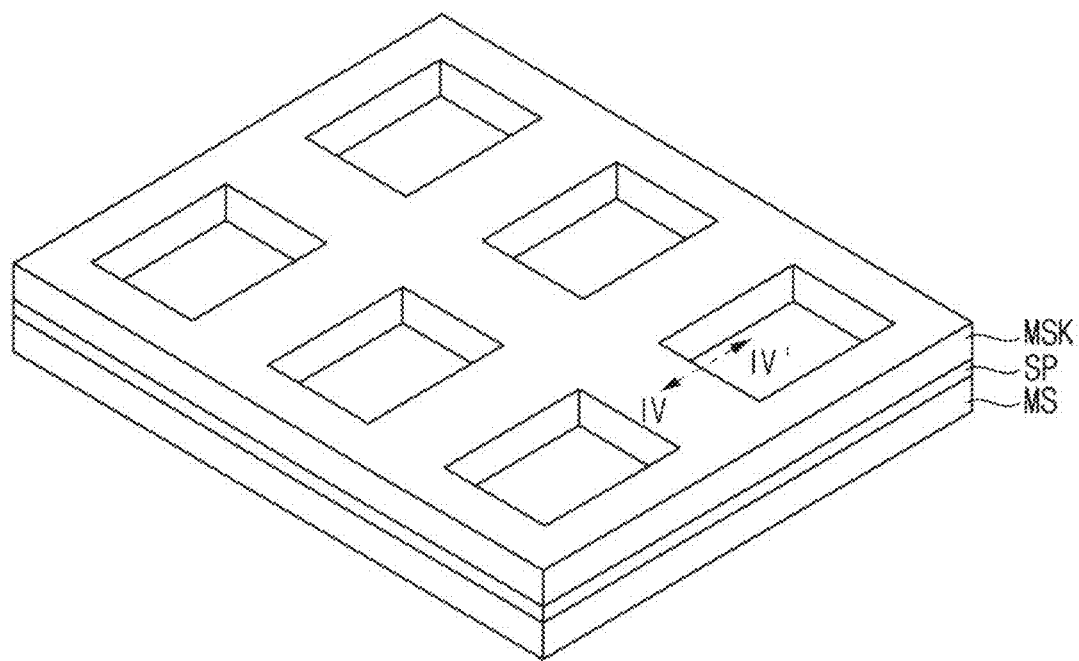
Figure 15:
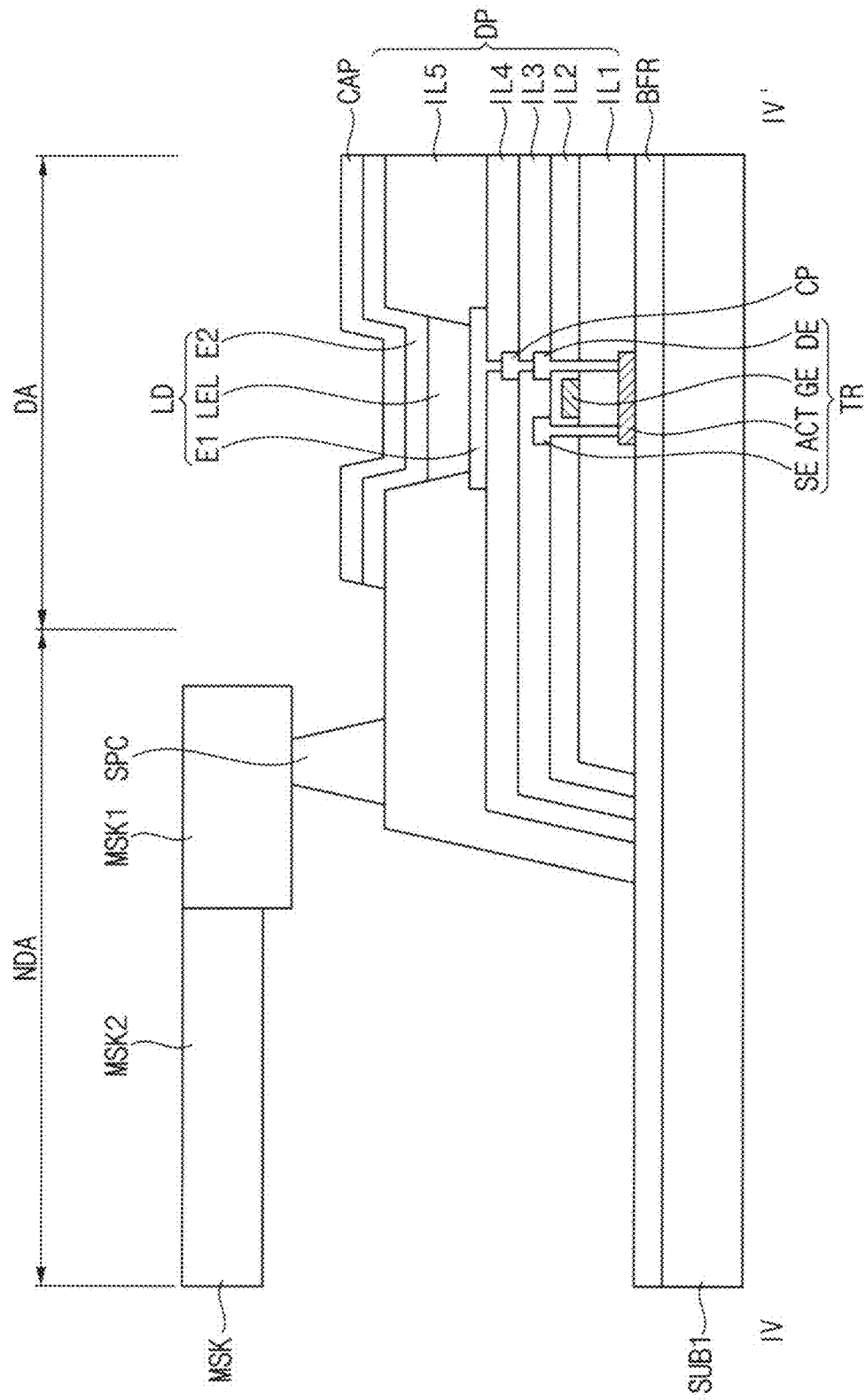

FIG. 15 is a cross-sectional view taken along line IV-IV' of FIG. 14.

Referring to FIGS. 13 to 15, the mask MSK may be disposed on the mother substrate MS. A mask supporter SP capable of supporting the mask MSK may be formed at an edge of the mother substrate MS. The mask MSK may contact the mask supporter SP and may be disposed on the mask supporter SP.

The mask MSK may contact the spacer SPC. An upper surface of the spacer SPC may contact the mask MSK. The spacer SPC may prevent the mask MSK from partially sagging.

The spacer SPC may contact the mask MSK in the first portion MSK1 of the mask MSK. A thickness t1 of the first portion MSK1 in the thickness direction DR3 may be greater than a thickness t2 of the second portion MSK2. In an embodiment, a lower surface of the first portion MSK1 is lower than a lower surface of the second portion MSK2. However, embodiments according to the present disclosure are not limited thereto, and the thickness t1 of the first portion MSK1 and the thickness t2 of the second portions MSK2 may be substantially the same in another embodiment.

Figure 16:
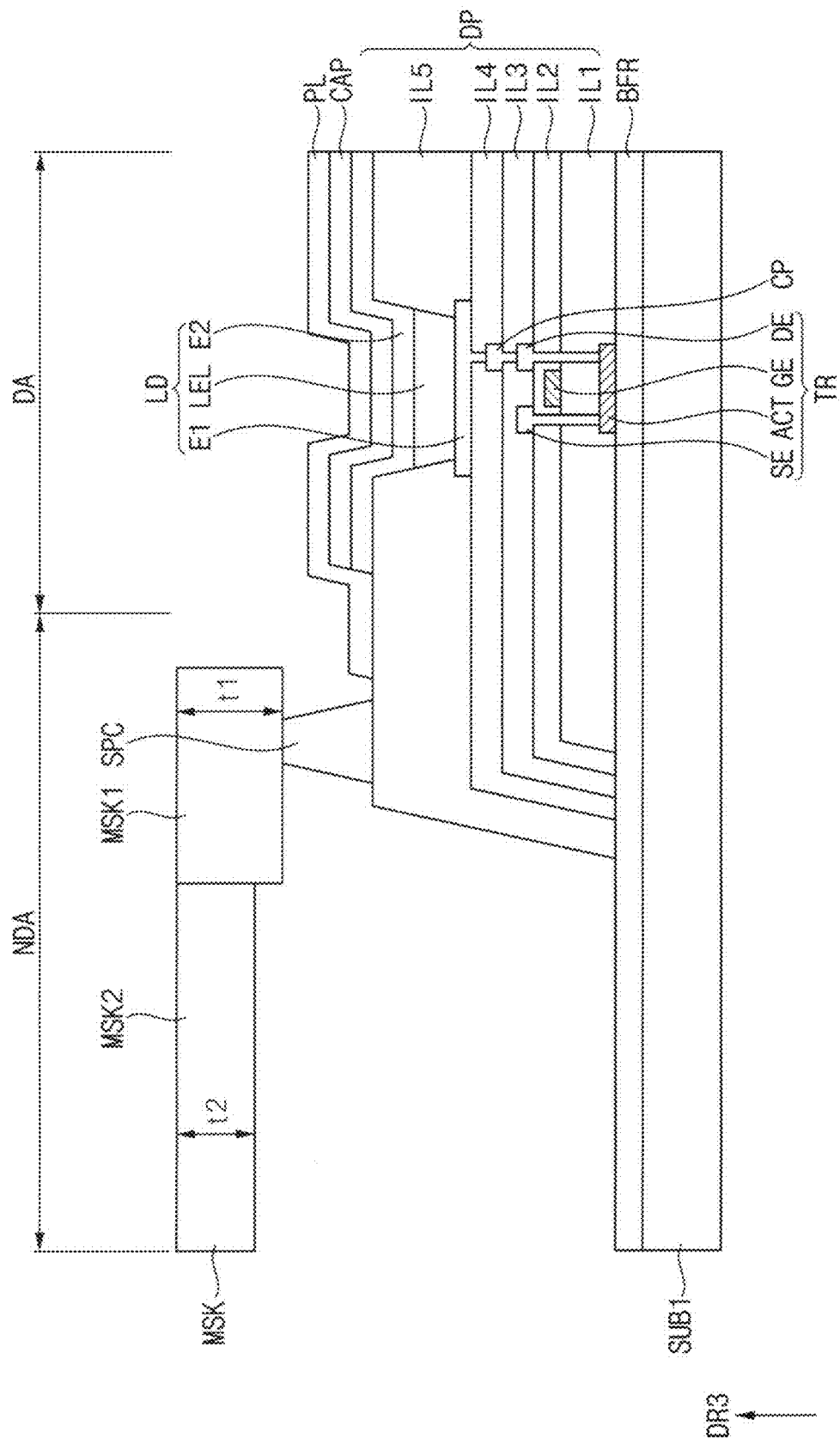

Referring to FIGS. 15 and 16, a protective layer PL may be formed using the mask MSK. The protective layer PL may be formed by depositing a deposition material using one of various deposition methods. For example, the protective layer PL may be formed by chemical vapor deposition ("CVD").

The deposition material may be deposited on the light emitting diode LD and the capping layer CAP through the openings OP of the mask MSK. The deposition material may be a material of the protective layer PL. Accordingly, the protective layer PL may cover the light emitting diode LD.

In an embodiment, since the spacer SPC contacts the mask MSK, the deposition material may be deposited only on the display area DA. That is, the spacer SPC may prevent the deposition material from being deposited on the non-display area NDA. The deposition material may be deposited to the inside of the display area DA and the spacer SPC in a plan view. Accordingly, the protective layer PL may be formed more inward than the spacer SPC in a plan view. That is, the protective layer PL may overlap the display area DA and the display panel DP. The protective layer PL may not overlap the non-display area NDA in a plan view.

When a deposition process of forming the protective layer PL is finished, the mask MSK may be removed from the mother substrate MS.

Figure 17:
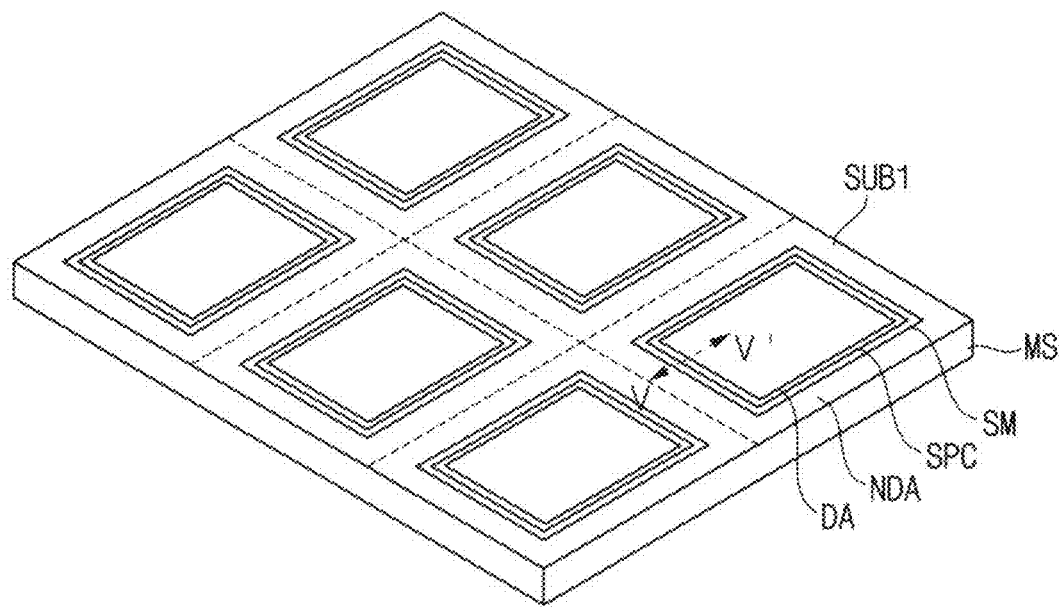
Figure 18:
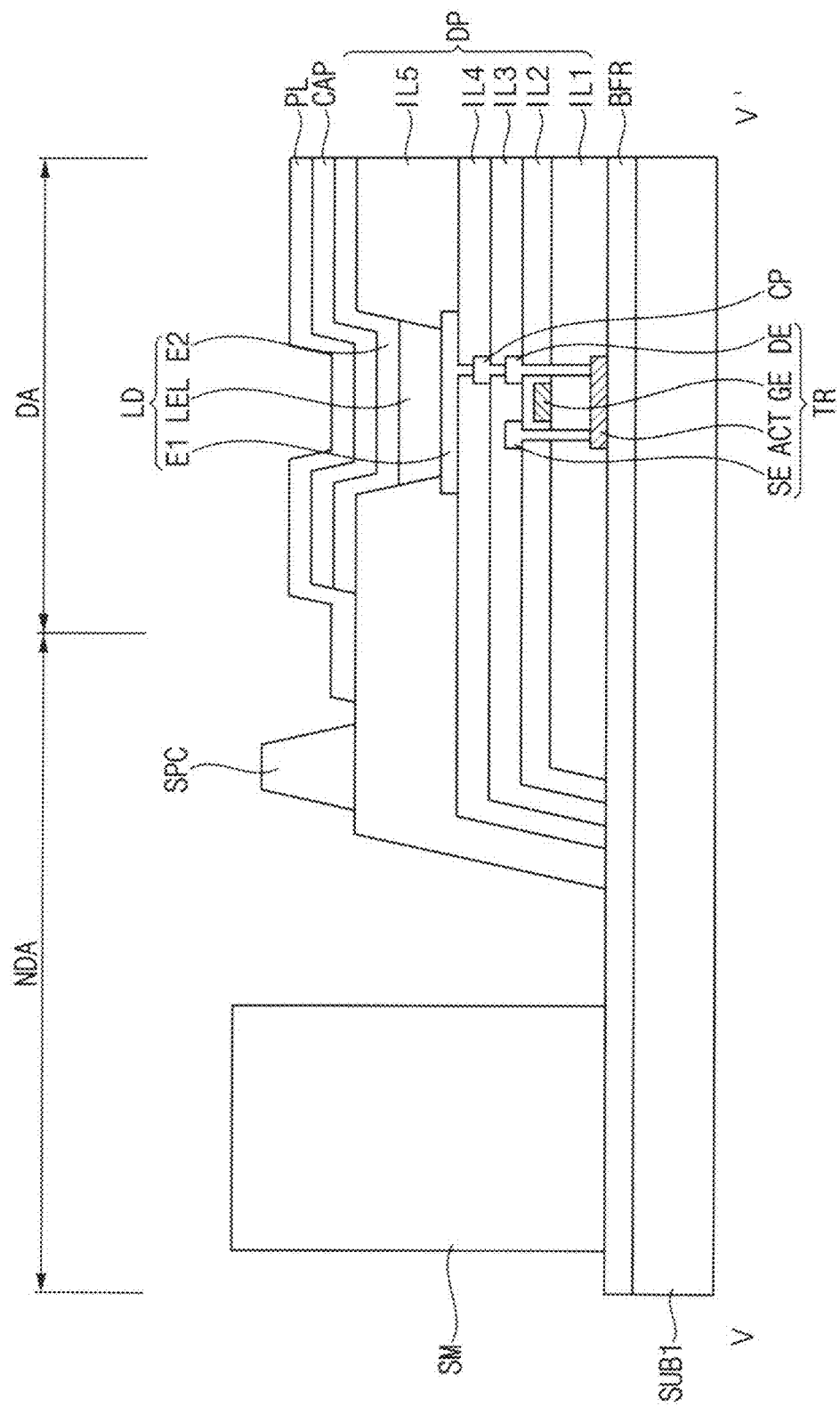

FIG. 18 is a cross-sectional view taken along the line V-V' of FIG. 17.

Referring to FIGS. 17 to 21, the first substrate SUB1 and the second substrate SUB2 may be combined using the sealing member SM.

Referring to FIGS. 17 and 18, the sealing member SM may be formed on the first substrate SUB1 and the buffer layer BFR. The sealing member SM may be formed in the non-display area NDA. The sealing member SM may surround the spacer SPC.

Figure 19:
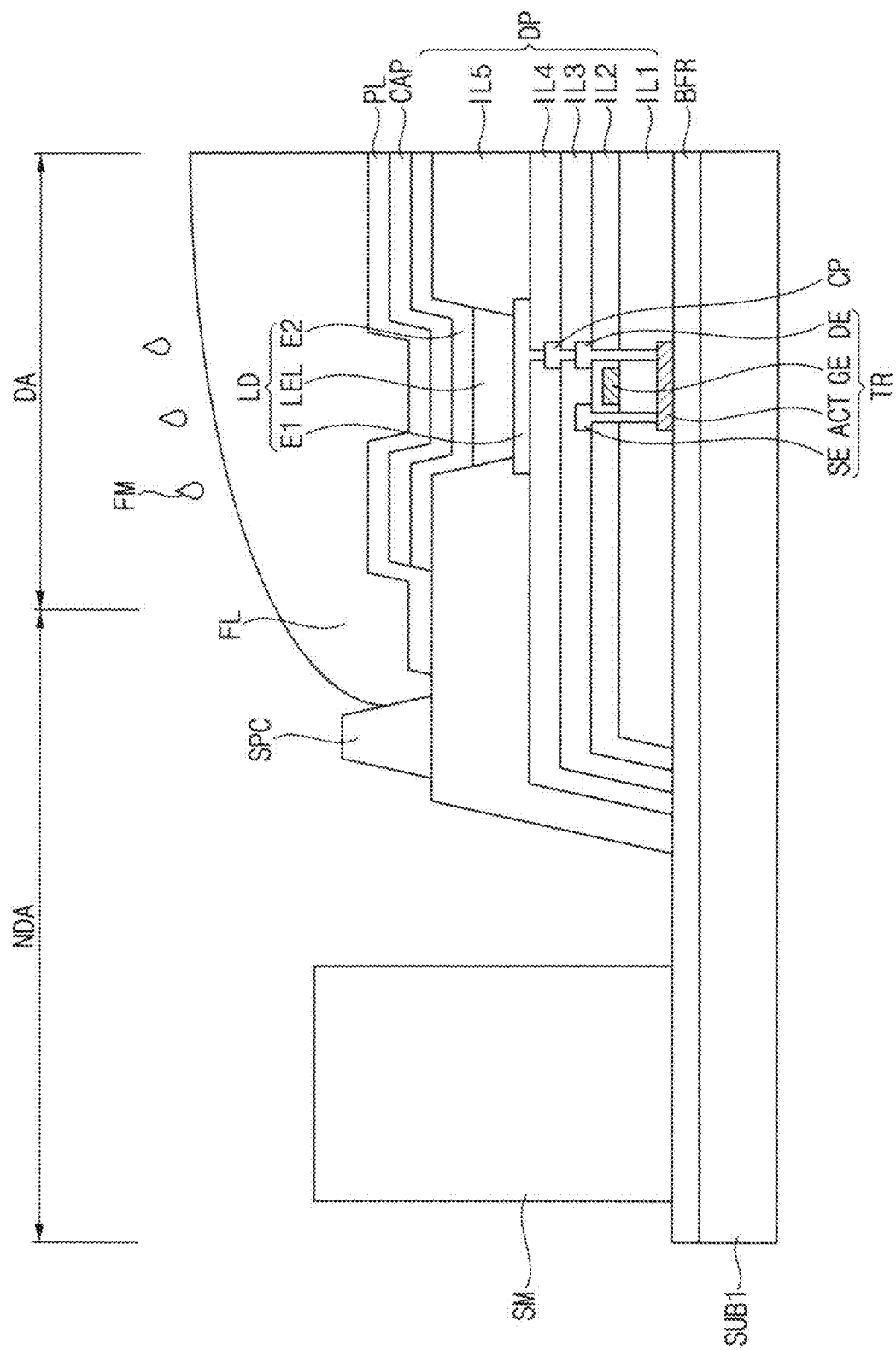
Figure 20:
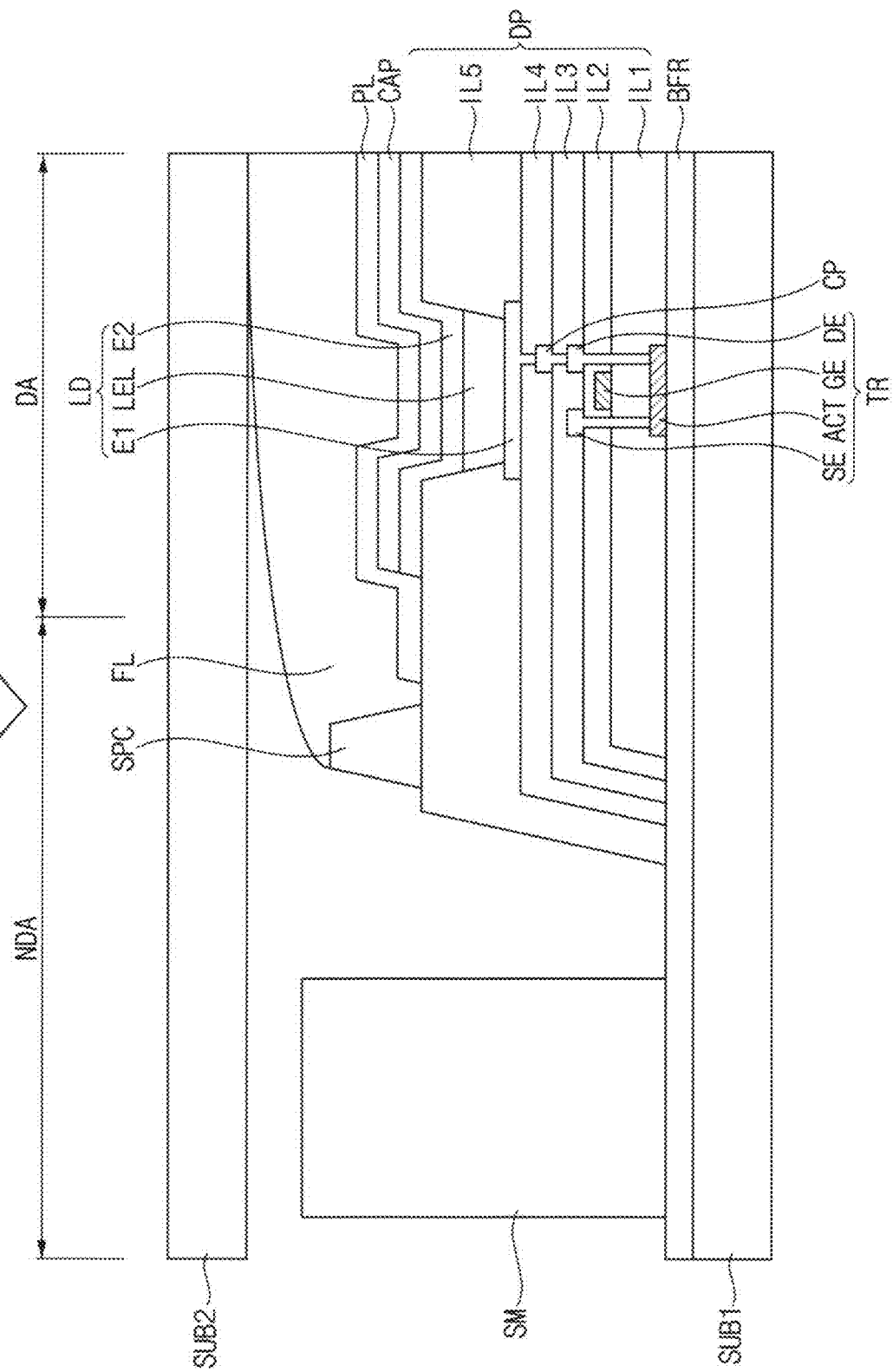
Figure 21:
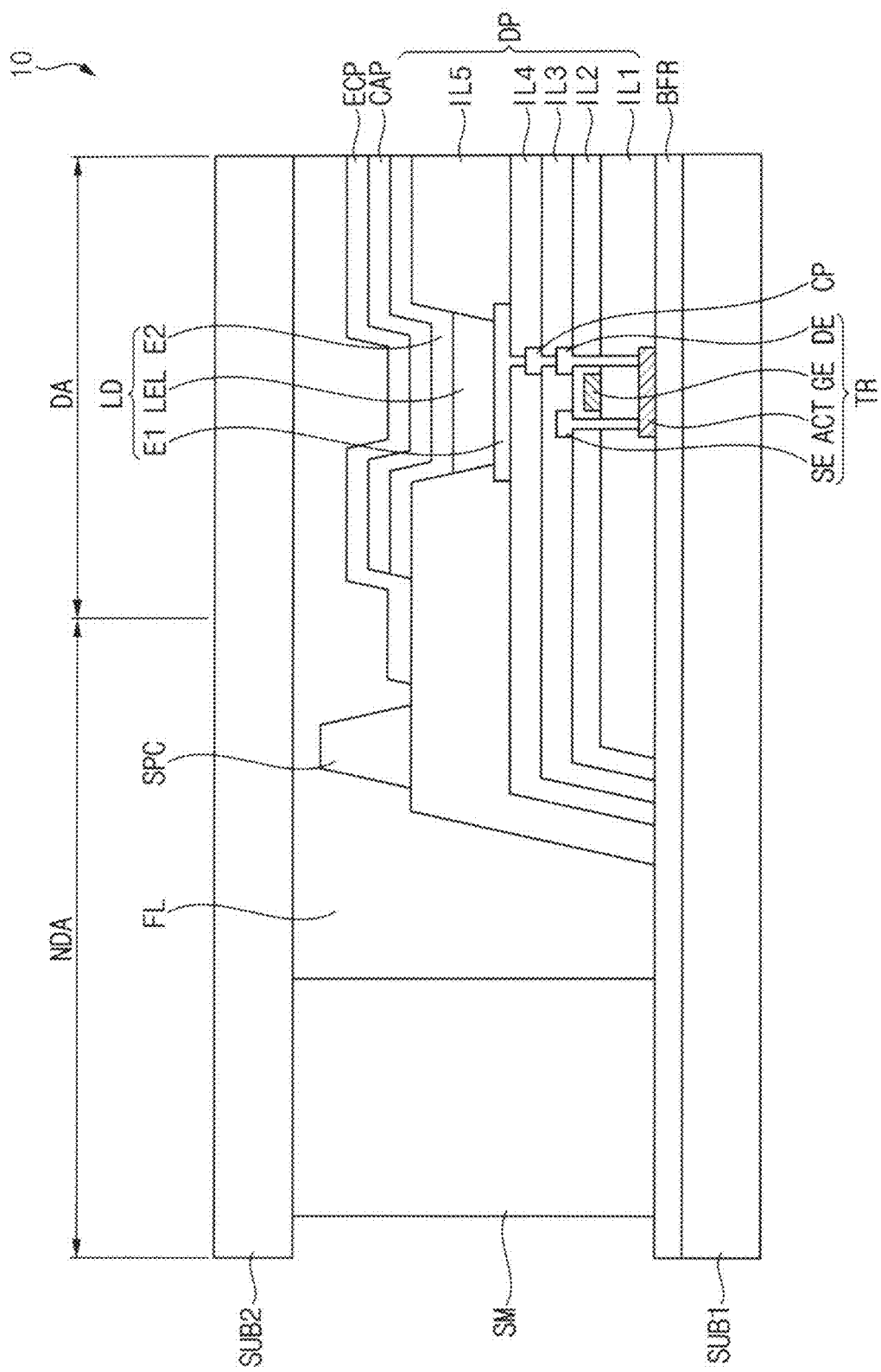

Referring to FIGS. 19 to 21, a filling material FM may be applied to the display area DA on the first substrate SUB1. The filler material FM may form the filler FL.

The second substrate SUB2 may be positioned on the filler FL. The filler FL may be pressed by the second substrate SUB2. The pressurized filler FL may be filled between the first substrate SUB1 and the second substrate SUB2. The filler FL may be pressed until the second substrate SUB2 comes into contact the sealing member SM.

In an embodiment, the spacer SPC and the second substrate SUB2 may not contact each other. Accordingly, the filler FL may fill the space between the sealing member SM and the spacer SPC beyond the spacer SPC. In this case, the filler FL may fill the display area DA and the non-display area NDA.

After the second substrate SUB2 is combined to the first substrate SUB1, the mother substrate MS may be cut. At least one display device may be formed by cutting the mother substrate MS.

In an embodiment, when the spacer SPC contacts the mask MSK, the deposition material may be deposited only on the display area DA. The deposition material may be deposited on the inside of the spacer SPC in a plan view, and the deposition material may not be disposed in the non-display area NDA on which the sealing member SM is disposed. As the sealing member SM is formed on the first substrate SUB1 on which the deposition material is not deposited, an adhesive force between the sealing member SM and the first substrate SUB1 and an adhesive force between the sealing member SM and the second substrate SUB2 may increase. Accordingly, a bonding force between the first substrate SUB1 and the second substrate SUB2 through the sealing member SM may increase.

In an embodiment, the spacer SPC may be spaced apart from the display area DA by about 1500 micrometers to about 1900 micrometers. As the spacer SPC is spaced apart from the display area DA, damage by the filler FL may be prevented. Accordingly, durability of the spacer SPC may be improved.

Figure 22:
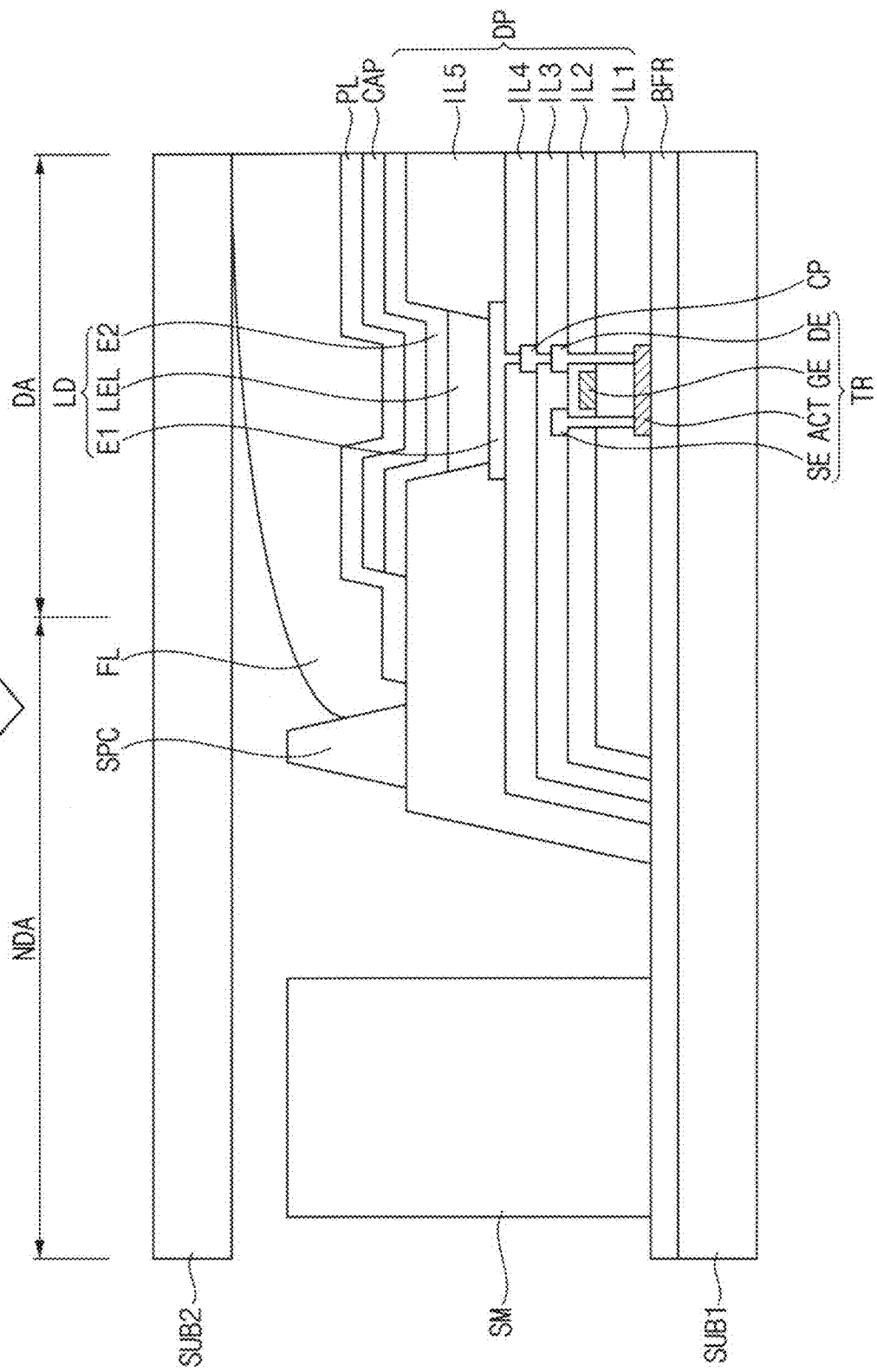
FIGS. 22 and 23 are cross-sectional views illustrating another example of FIGS. 20 and 21.
Figure 23:
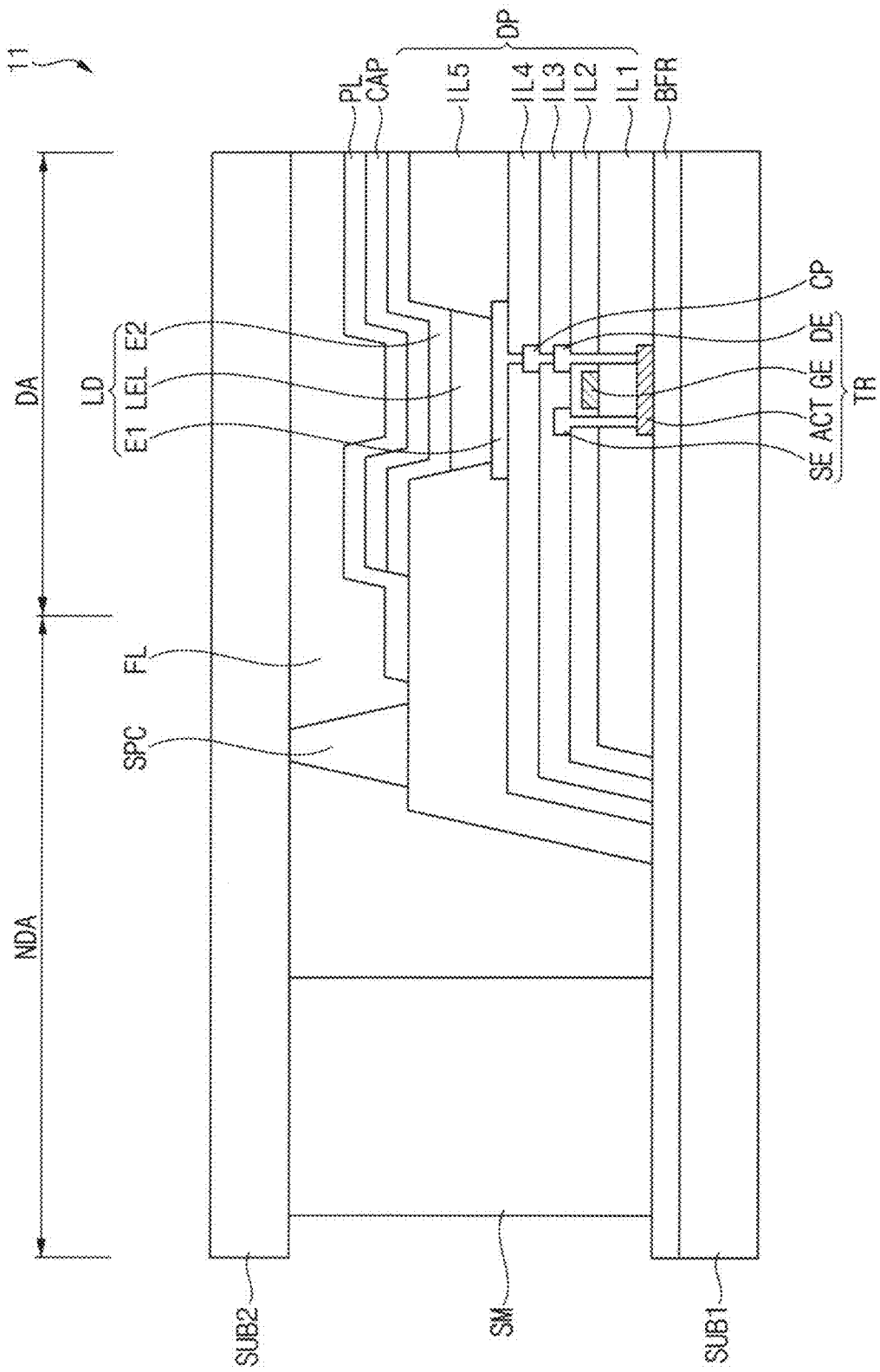

FIGS. 22 and 23 are cross-sectional views illustrating another example of FIGS. 20 and 21.

In a method of manufacturing a display device 11 described with reference to FIGS. 22 and 23, a description overlapping with the method of manufacturing the display device 10 described with reference to FIGS. 9 to 21 may be omitted.

For example, FIGS. 22 and 23 may illustrate a method of manufacturing the display device 11 of FIG. 4.

Referring to FIGS. 22 and 23, a filling material FM may be applied to the display area DA on the first substrate SUB1. The filling material FM may form the filler FL. The second substrate SUB2 may be positioned on the filler FL. The filler FL may be pressed by the second substrate SUB2. The pressurized filler FL may be filled between the first substrate SUB1 and the second substrate SUB2. The filler FL may be pressed until the second substrate SUB2 comes into contact the sealing member SM.

In an embodiment, the spacer SPC and the second substrate SUB2 may contact each other. An upper surface of the spacer SPC and the second substrate SUB2 may contact each other. Accordingly, the filler FL may be disposed more inward than the spacer SPC in a plan view. That is, the filler may not reach the space between the sealing member SM and the spacer SPC in a plan view. In this case, the filler FL may entirely fill the display area DA, and may fill only a portion of the non-display area NDA.

Figure 24:
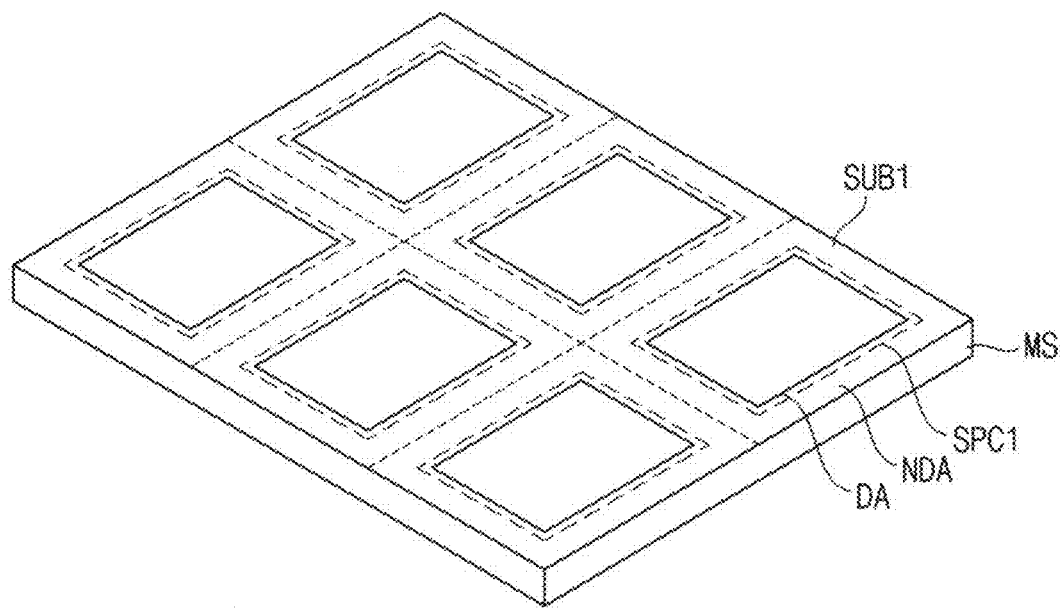
FIG. 24 is a perspective view illustrating another example of the spacer of FIG. 9.

FIG. 24 is a perspective view illustrating another example of the spacer of FIG. 9.

For example, FIG. 24 may illustrate a method of manufacturing the display device 12 of FIGS. 5 to 7.

Referring to FIGS. 10 and 24, in the non-display area NDA, a spacer SPC1 may be formed on the fifth insulation layer IL5. The fifth insulation layer IL5 and the spacer SPC1 may have the same material. The spacer SPC1 may be formed simultaneously with the fifth insulation layer IL5.

The spacer SPC1 may surround the display area DA. First, the spacer SPC1 may be formed in a continuous band shape. After that, portions of the spacer SPC1 may be removed. The portions of the spacer SPC1 may be removed through a photo process using a mask. Accordingly, the spacer SPC1 may have a strip shape in which the spacer SPC1 is partially removed.

The portions of the spacer SPC1 may be removed to form sub-spacers SSPC. The sub-spacers SSPC may be spaced apart from each other.

In an embodiment, as the portions of the spacer SPC1 are removed, a space may be formed between the sub-spacers SSPC. The space may be defined as recesses (e.g., the recesses RCS of FIG. 5). Accordingly, gas generated by the outgassing may be discharged through the recesses. Damage of the light emitting diode LD due to the outgassing may be prevented.

Figure 25:
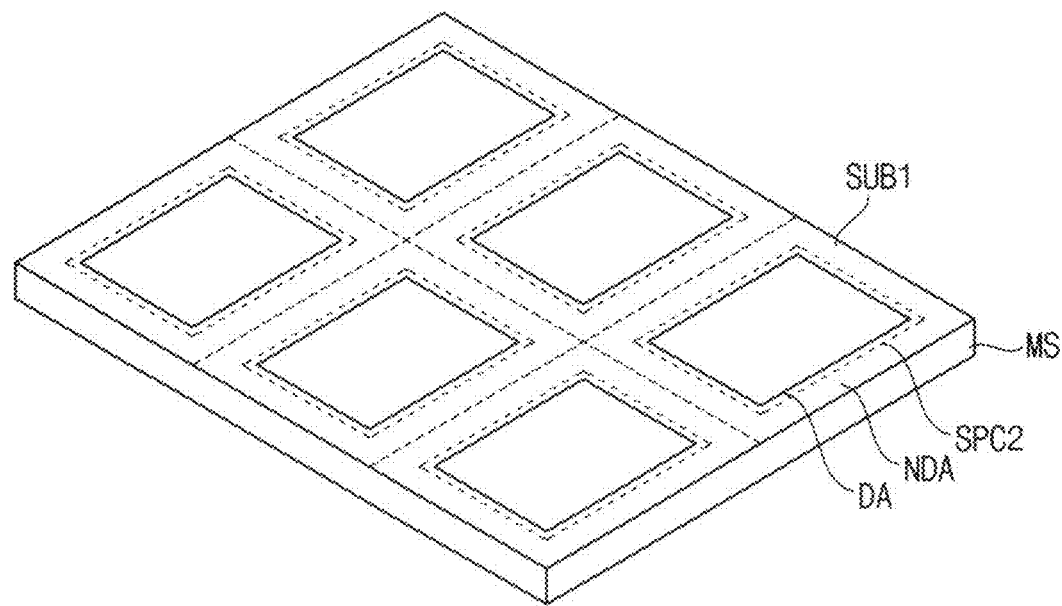
FIG. 25 is a perspective view illustrating still another example of the spacer of FIG. 9.

FIG. 25 is a perspective view illustrating still another example of the spacer of FIG. 9.

For example, FIG. 25 may illustrate a method of manufacturing the display device 13 of FIG. 8. In the spacer SPC2 described with reference to FIG. 25, a description overlapping with the spacer SPC1 described with reference to FIG. 24 may be omitted.

Referring to FIG. 25, a spacer SPC2 may be formed on the fifth insulation layer IL5 in the non-display area NDA. First, the spacer SPC2 may surround the display area DA. The spacer SPC2 may be formed in a continuous band shape. After that, portions of the spacer SPC2 may be removed. The portions of the spacer SPC2 may be removed through a photo process using a mask. Accordingly, the spacer SPC2 may have a band shape from which the spacer SPC2 is partially removed.

The portions of the spacer SPC2 may be removed to form sub-spacers SSPC. The sub spacers SSPC may be spaced apart from each other.

The sub-spacers SSPC of FIG. 25 may have a shorter length than the sub-spacers SSPC of FIG. 24. Also, the number of sub-spacers SSPC of FIG. 25 may be greater than the number of sub-spacers SSPC of FIG. 24.

The display device and the method according to the embodiments may be applied to a display device included in a computer, a notebook, a mobile phone, a smartphone, a smart pad, a PMP, a PDA, an MP3 player, or the like.

Although the display device and the method according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
    a first substrate including a display area including pixels and a non-display area adjacent to the display area;
    a second substrate facing to the first substrate;
    a sealing member contacting the first substrate and the second substrate and disposed in the non-display area;
    a light emitting diode disposed on the first substrate in the display area;
    a protective layer covering the light emitting diode and spaced apart from the sealing member;
    a spacer disposed in the non-display area, disposed between the protective layer and the sealing member and surrounding the display area; and
    a filler disposed between the first substrate and the second substrate.

2. The display device of claim 1, wherein the spacer has a closed loop shape and surrounds the display area in a plan view.

3. The display device of claim 2, wherein an upper surface of the spacer is spaced apart from a lower surface of the second substrate, and
    the filler overlaps the spacer and is disposed more inward than the sealing member in the plan view.

4. The display device of claim 2, wherein an upper surface of the spacer contacts the second substrate, and
    the filler is disposed more inward than the spacer in the plan view.

5. The display device of claim 1, wherein the spacer includes sub-spacers adjacent to each other in a plan view.

6. The display device of claim 5, wherein the sub-spacers are spaced apart from each other.

7. The display device of claim 5, wherein the filler is disposed more inward than the sealing member in the plan view.

8. The display device of claim 1, wherein a first length from an upper surface of the first substrate to an upper surface of the spacer is greater than a second length from the upper surface of the first substrate to an upper surface of the protective layer in a thickness direction.

9. A method of manufacturing a display device, the method comprising:
    forming a spacer in a non-display area adjacent to a display area on a first substrate;
    forming a light emitting diode in the display area on the first substrate;
    positioning a mask having an opening on the first substrate to contact an upper surface of the spacer;
    forming a protective layer covering the light emitting diode; and
    combining the first substrate and a second substrate using a sealing member.

10. The display device of claim 9, wherein the light emitting diode is spaced apart from the spacer.

11. The display device of claim 9, wherein the spacer is formed in a closed loop shape and surrounds the display area.

12. The display device of claim 11, further comprising:
    forming sub-spacers by removing a portion of the spacer.

13. The display device of claim 12, wherein the sub-spacers are spaced apart from each other.

14. The display device of claim 9, wherein the protective layer is formed by chemical vapor deposition.

15. The display device of claim 9, wherein the combining of the first substrate and the second substrate includes:
   forming the sealing member surrounding the spacer in the non-display area on the first substrate;
   forming a filler in the display area on the first substrate;
   positioning the second substrate on the filler; and
   combining the first substrate and the second substrate by contacting the second substrate with the sealing member.

16. The display device of claim 15, wherein the filler fills between the first substrate and the second substrate by pressing the filler by the second substrate.

17. The display device of claim 9, wherein the protective layer is formed more inward than the spacer in a plan view.

18. The display device of claim 9, wherein the mask includes a first portion defining the opening and a second portion surrounding the first portion.

19. The display device of claim 18, wherein the spacer contacts the first portion of the mask.

20. The display device of claim 18, wherein a thickness of the first portion is greater than a thickness of the second portion.

\* \* \* \* \*